US012643168B2

(12) United States Patent
Min et al.

(10) Patent No.: US 12,643,168 B2
(45) Date of Patent: Jun. 2, 2026

(54) APPARATUS FOR SOLDERING ELECTRONIC DEVICES

(71) Applicant: Samsung Electronics Co., Ltd., Suwon-si (KR)

(72) Inventors: Kyungdeuk Min, Suwon-si (KR); Sinyeop Lee, Suwon-si (KR); Taegyu Kang, Suwon-si (KR); Jaeseon Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 19/020,525

(22) Filed: Jan. 14, 2025

(65) Prior Publication Data

US 2025/0239563 A1      Jul. 24, 2025

(30) Foreign Application Priority Data

Jan. 24, 2024      (KR) ........................ 10-2024-0011084

(51) Int. Cl.
| | |
|---|---|
| *B23K 3/08* | (2006.01) |
| *B23K 1/00* | (2006.01) |
| *H05B 3/00* | (2006.01) |
| *H10W 72/00* | (2026.01) |
| *B23K 101/40* | (2006.01) |

(52) U.S. Cl.
CPC ............ *B23K 3/087* (2013.01); *B23K 1/0016* (2013.01); *H05B 3/0047* (2013.01); *B23K 2101/40* (2018.08); *H10W 72/07141* (2026.01)

(58) Field of Classification Search
None
See application file for complete search history.

(56) References Cited

U.S. PATENT DOCUMENTS

| | | | | |
|---|---|---|---|---|
| 7,187,066 B2 * | 3/2007 | Frutschy | ................. | H01L 24/13 |
| | | | | 257/E23.021 |
| 8,661,655 B2 | 3/2014 | Weekamp et al. | | |

(Continued)

FOREIGN PATENT DOCUMENTS

| | | | | | |
|---|---|---|---|---|---|
| CN | 119605334 A | * | 3/2025 | ............ | H10H 20/85 |
| JP | H063816 B2 | | 1/1994 | | |

(Continued)

*Primary Examiner* — Devang R Patel
(74) *Attorney, Agent, or Firm* — Fish & Richardson P.C.

(57) ABSTRACT

An apparatus may include a base plate configured to support a package substrate, semiconductor chips on the package substrate in rows and columns; a lamp heater configured to irradiate light to the semiconductor chips to mount the semiconductor chips on the package substrate; and a pressurization mask including a transparent plate between the base plate and the lamp heater. The transparent plate includes a first surface facing the base plate and a second surface opposite to the first surface, light absorbing patterns on transmission regions of the first surface, such that the plurality of light absorbing patterns at least partially overlap with corresponding semiconductor chips of the plurality of semiconductor chips in the vertical direction, and a light reflecting pattern on a reflection region of the second surface, wherein the reflection region is not overlapped with transmission regions in the vertical direction.

19 Claims, 29 Drawing Sheets

(56)    References Cited

U.S. PATENT DOCUMENTS

|             |       |         |                |              |
| ----------- | ----- | ------- | -------------- | ------------ |
| 8,963,050   | B2 *  | 2/2015  | Kato .................. | F27B 17/0025 |
|             |       |         |                | 219/385      |
| 10,304,709  | B2    | 5/2019  | Hendriks et al. |              |
| 10,304,797  | B2 *  | 5/2019  | Arutinov ............. | H05K 3/3436  |
| 2002/0179589 | A1 * | 12/2002 | Morita ............... | H10P 72/0602 |
|             |       |         |                | 219/390      |
| 2021/0043597 | A1   | 2/2021  | Zhang et al.   |              |

FOREIGN PATENT DOCUMENTS

|    |               |      |    |         |     |           |            |
| -- | ------------- | ---- | -- | ------- | --- | --------- | ---------- |
| JP | 2001-0345505  | A    |    | 12/2001 |     |           |            |
| JP | 2020-0173958  | A    |    | 10/2020 |     |           |            |
| KR | 100726740     | B1   | *  | 6/2007  | ........... | G02F 1/1339 |

\* cited by examiner

Figure 12:
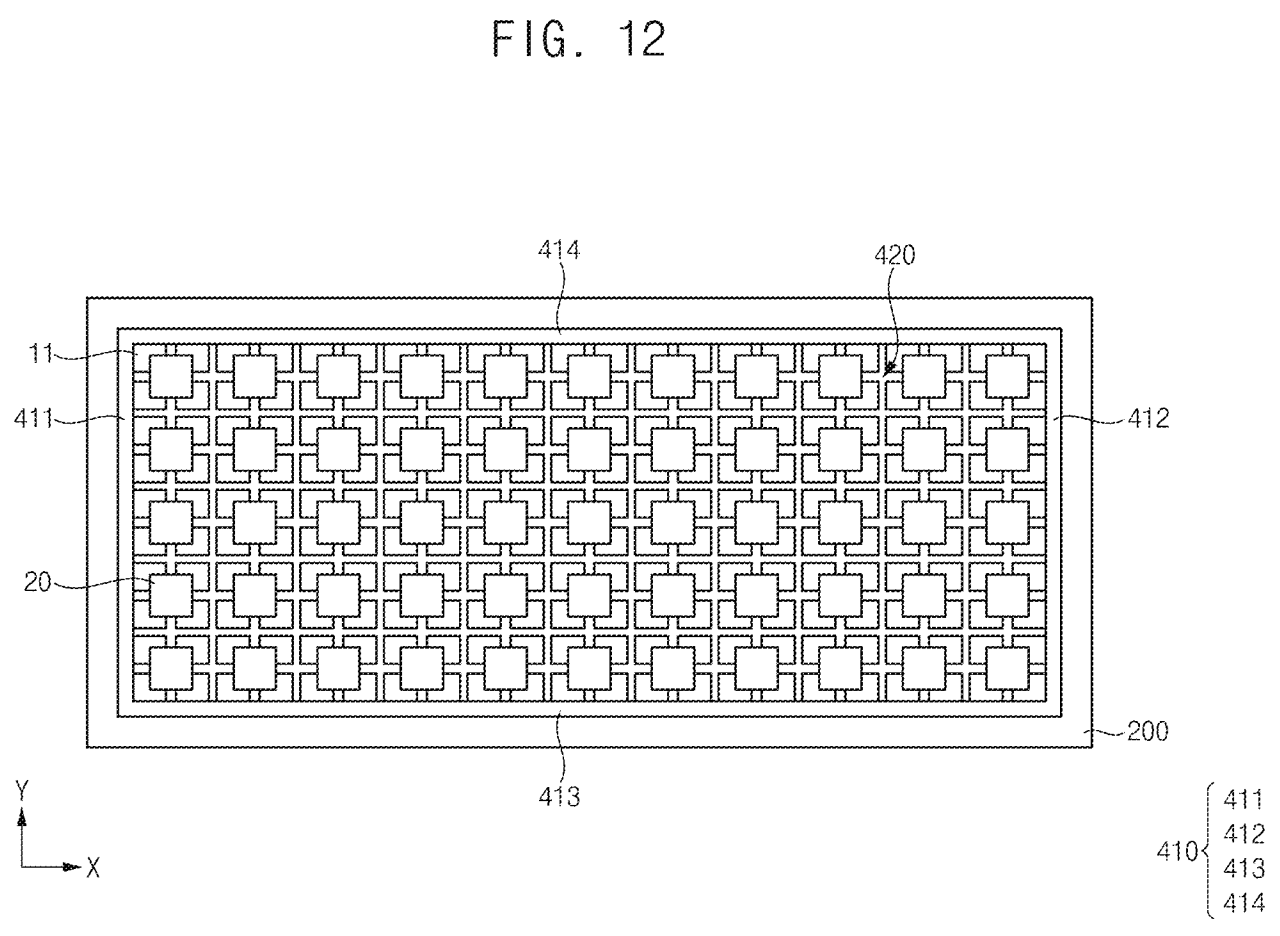

Figure 13:
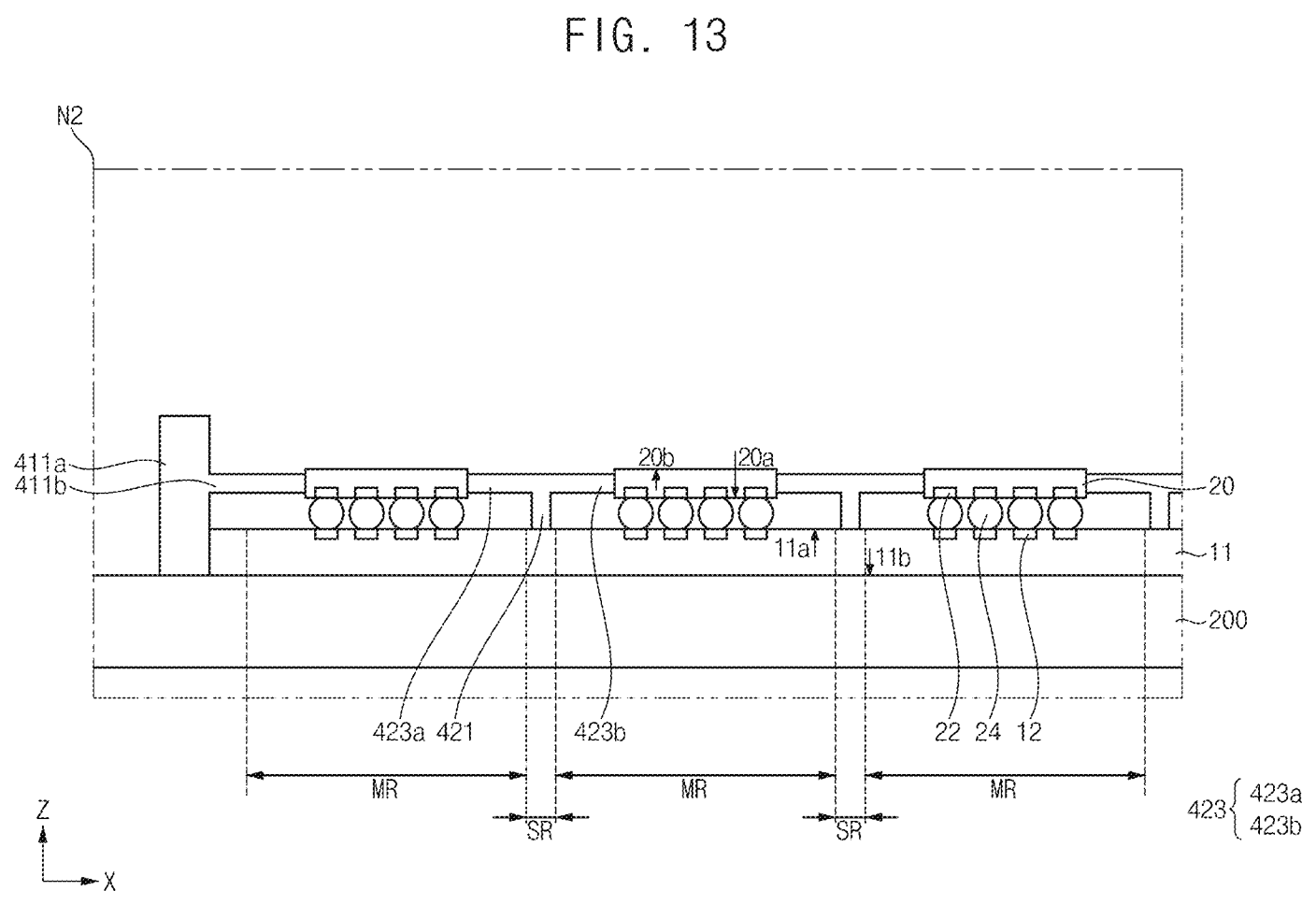

APPARATUS FOR SOLDERING ELECTRONIC DEVICES

CROSS-REFERENCE TO RELATED APPLICATION

This application claims priority under 35 U.S.C. § 119 to Korean Patent Application No. 10-2024-0011084, filed on Jan. 24, 2024, in the Korean Intellectual Property Office (KIPO), the contents of which are herein incorporated by reference in their entirety.

BACKGROUND

1. Field

Example embodiments relate to apparatuses for soldering electronic devices. More particularly, example embodiments relate to apparatuses for soldering electronic devices by using an intense pulsed light (IPL).

2. Description of the Related Art

In a soldering process of mechanically and electrically connecting electronic devices to a substrate, an intense pulsed light (IPL) method, which has a process time and lower power consumption, may be introduced, compared to the exiting convection reflow method that transfers heat by heating the atmosphere. However, in a case of silicon die, efficiency of heat transfer by radiation may be relatively low due to high light reflectivity. Therefore, in the case of the silicon die, a lot of radiant energy may be required for the soldering process by using an IPL apparatus. Additionally, warpage may occur in the substrate due to the radiant energy.

SUMMARY

Some example embodiments provide an apparatus for soldering electronic devices that is able to increase an efficiency of heat transfer and to reduce, minimize, or prevent warpage of a semiconductor package.

According to some example embodiments, an apparatus for soldering electronic devices may include a base plate configured to support a package substrate, wherein a plurality of semiconductor chips are on the package substrate in a plurality of rows and a plurality of columns; a lamp heater configured to irradiate light to the plurality of semiconductor chips in a vertical direction in order to mount the plurality of semiconductor chips on the package substrate; and a pressurization mask including a transparent plate between the base plate and the lamp heater. The transparent plate may include a first surface facing the base plate and a second surface opposite to the first surface, a plurality of light absorbing patterns on a plurality of transmission regions of the first surface of the transparent plate, such that the plurality of light absorbing patterns at least partially overlap with corresponding semiconductor chips of the plurality of semiconductor chips, and a light reflecting pattern on a reflection region of the second surface of the transparent plate, wherein the reflection region is not overlapped with the plurality of transmission regions in the vertical direction.

According to some example embodiments, an apparatus for soldering electronic devices may include a base plate configured to support a package substrate, wherein a plurality of semiconductor chips are on the package substrate in a plurality of rows and a plurality of columns; a lamp heater configured to irradiate light to the plurality of semiconductor chips in a vertical direction in order to mount the plurality of semiconductor chips on the package substrate; a pressurization mask including a transparent plate between the base plate and the lamp heater, wherein the transparent plate may include a first surface facing the base plate and a second surface opposite to the first surface and a plurality of light absorbing patterns on a plurality of transmission regions of the first surface of the transparent plate, wherein the plurality of transmission regions at least partially overlap with corresponding semiconductor chips of the plurality of semiconductor chips in the vertical direction; and a mask holder secured to outer portions of the transparent plate, the mask holder configured to move the pressurization mask in the vertical direction to apply pressure to the plurality of semiconductor chips.

According to some example embodiments, an apparatus for soldering electronic devices may include a base plate configured to support a package substrate, wherein a plurality of semiconductor chips are on the package substrate and a plurality of conductive connection members are on a lower surface of each semiconductor chip of the plurality of semiconductor chips; a lamp heater configured to irradiate light to the plurality of semiconductor chips in a vertical direction, to mount the plurality of semiconductor chips on the package substrate via separate, respective conductive connection members of the plurality of conductive connection members; a pressurization mask including a transparent plate between the base plate and the lamp heater, wherein the transparent plate includes a first surface facing the base plate and a second surface opposite to the first surface and a light reflecting pattern on a reflection region of the second surface of the transparent plate, wherein the reflection region is not overlapped with the plurality of conductive connection members in the vertical direction; and a mask holder secured to outer portions of the transparent plate, the mask holder configured to move the pressurization mask in the vertical direction.

According to some example embodiments, in a method of soldering electronic devices, a package substrate is loaded on a base plate, wherein the package substrate includes a plurality of semiconductor chips having a plurality of rows and a plurality of columns. A pressurization mask is provided, wherein the pressurization mask including a transparent plate having a first surface facing the base plate and a second surface opposite to the first surface, a plurality of light absorbing patterns disposed on the first surface of the transparent plate, and a light reflecting pattern disposed on the second surface of the transparent plate. The pressurization mask is aligned such that the plurality of light absorbing patterns correspond to the plurality of semiconductor chips. The pressurization mask is moved in a vertical direction such that pressurized surfaces of the plurality of light absorbing patterns of the pressurization mask are in contact with upper surfaces of the plurality of semiconductor chips. Light is irradiated to the pressurization mask by using the lamp heater that is located above the pressurization mask. Heat may be selectively transmitted on the plurality of semiconductor chips of the package substrate by using the pressurization mask.

According to some example embodiments, in a method of soldering electronic devices, a package substrate is loaded on a base plate, wherein the package substrate includes a plurality of semiconductor chips having a plurality of rows and a plurality of columns. A pressurization mask is provided, wherein the pressurization mask including a transparent plate having a plurality of transmission regions corresponding to the plurality of semiconductor chips on a work surface and a reflection region excluding the plurality of transmission region on a work surface, a plurality of light absorbing patterns disposed on the plurality of transmission regions of the transparent plate, and a light reflecting pattern disposed on the reflection region of the transparent plate. The plurality of semiconductor chips are disposed in a plurality of recesses of a supporting member, and the plurality of semiconductor chips are secured by using a plurality of horizontal supporting members of the supporting member. The pressurization mask is aligned such that the plurality of light absorbing patterns correspond to the plurality of semiconductor chips. The pressurization mask is aligned such that the plurality of light absorbing patterns of the pressurization mask correspond to the plurality of semiconductor chips. The pressurization mask is moved along a plurality of guides of the supporting member to apply pressure on the plurality of semiconductor chips while keeping the pressurization mask horizontal. Light is irradiated to the pressurization mask by using the lamp heater that is located above the pressurization mask. Light that is transmitted through the reflection region of the transparent plate is blocked by the light reflecting pattern, and light that is irradiated to the plurality of transmission regions of the transparent plate is absorbed by the plurality of light absorbing patterns. The plurality of light absorbing patterns may convert the absorbed light into heat and transfer the heat to the plurality of semiconductor chips.

According to some example embodiments, an apparatus for soldering electronic devices may include a base plate configured to load a package substrate providing a plurality of semiconductor chips, a lamp heater configured to irradiate light to the plurality of semiconductor chips, and a pressurization mask moving in a vertical direction to apply pressure to the plurality of semiconductor chips.

The pressurization mask may include a transparent plate providing a first surface facing the base plate and a second surface opposite to the first surface, a plurality of light absorbing patterns disposed on a plurality of transmission regions of the first surface of the transparent plate, wherein the plurality of transmission regions correspond to the plurality of semiconductor chips, and a light reflecting pattern disposed on a reflection region of the second surface of the transparent plate, wherein the reflection region is not overlapped with the plurality of transmission regions. The plurality of light absorbing patterns may absorb the light that is passed (is transmitted) through the plurality of transmission regions. The light reflecting pattern may reflect a portion of light that is irradiated (is emitted) from the lamp heater.

Accordingly, the apparatus for soldering electronic devices may transfer heat to each of a plurality of semiconductor chips through the plurality of light absorbing patterns by using a conduction method for a heat transfer. Thus, efficiency of heat transfer to the semiconductor chip may be increased.

Additionally, the light reflecting pattern of the apparatus for soldering electronic devices may block light from being irradiated to a region excluding mounting regions. Therefore, the light reflecting pattern may prevent warpage of the package substrate due to radiant energy. Additionally, the pressurization mask of the apparatus for soldering electronic devices may directly prevent warpage of the package substrate by applying pressure to the package substrate.

4

Figure 1:
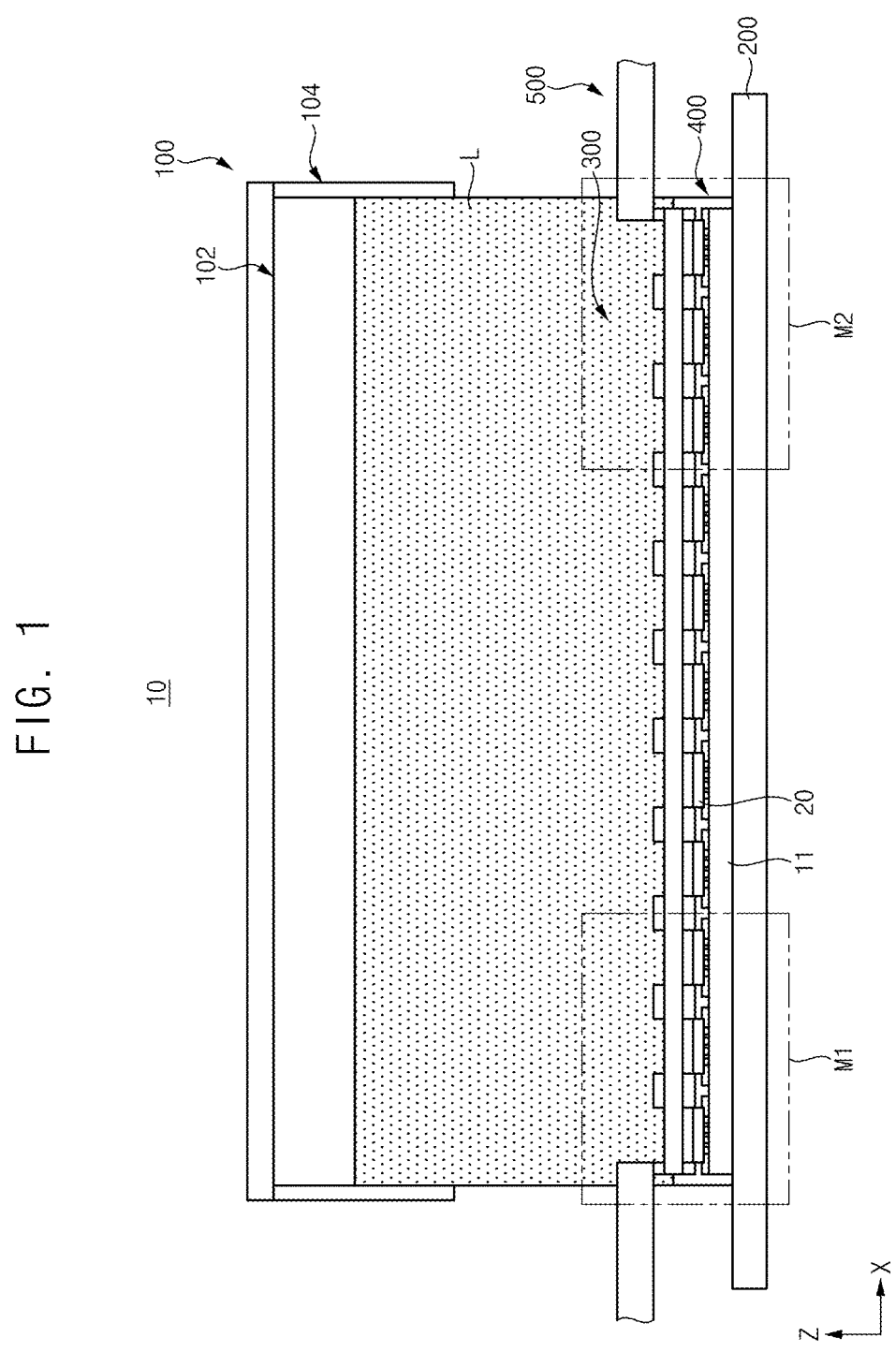
FIG. 1 is a plan view illustrating an apparatus for soldering electronic devices in accordance with some example embodiments.
Figure 2:
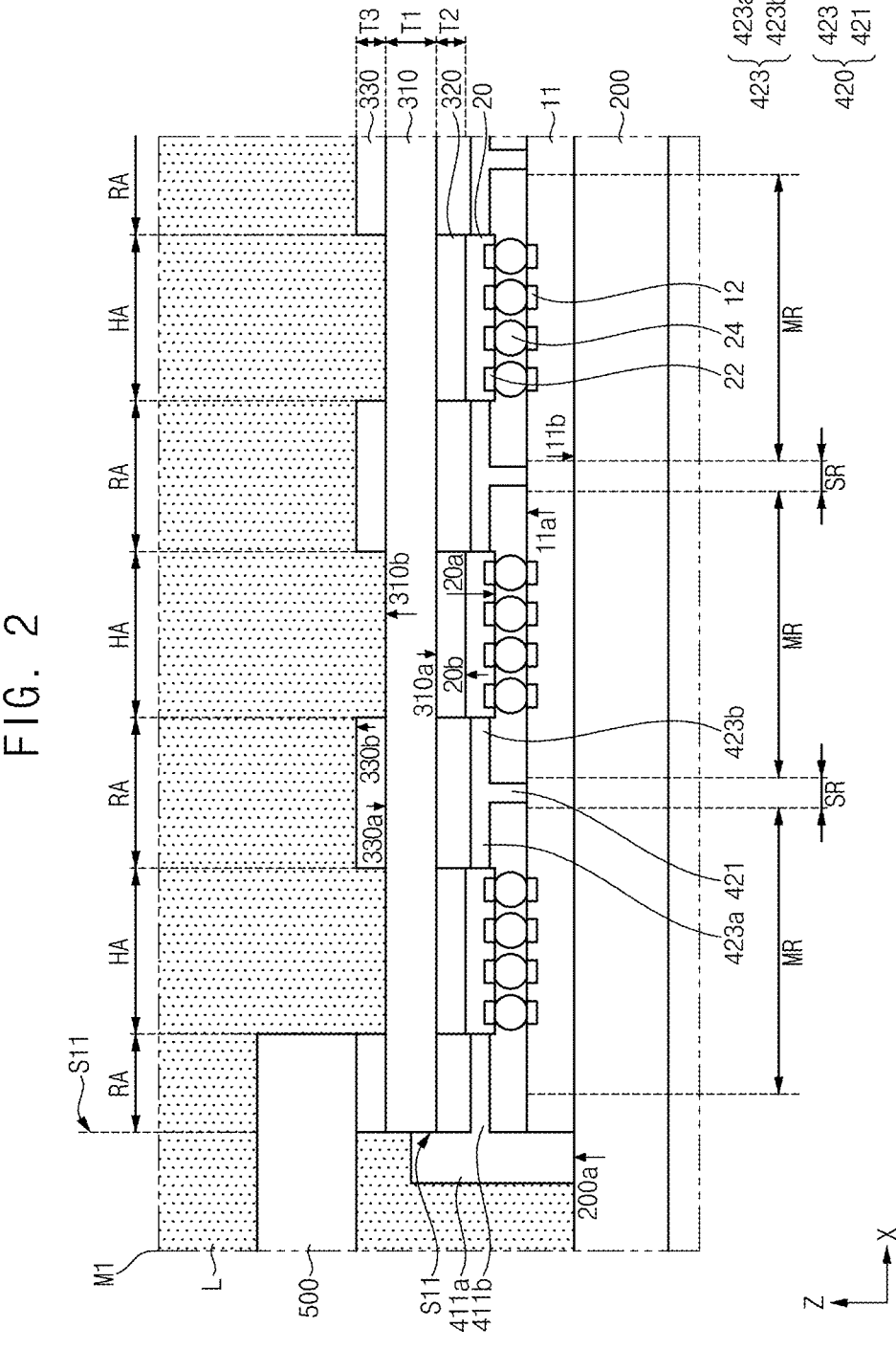

FIG. 2 is an enlarged view illustrating portion 'M1' in FIG. 1 in accordance with some example embodiments.

Figure 3:
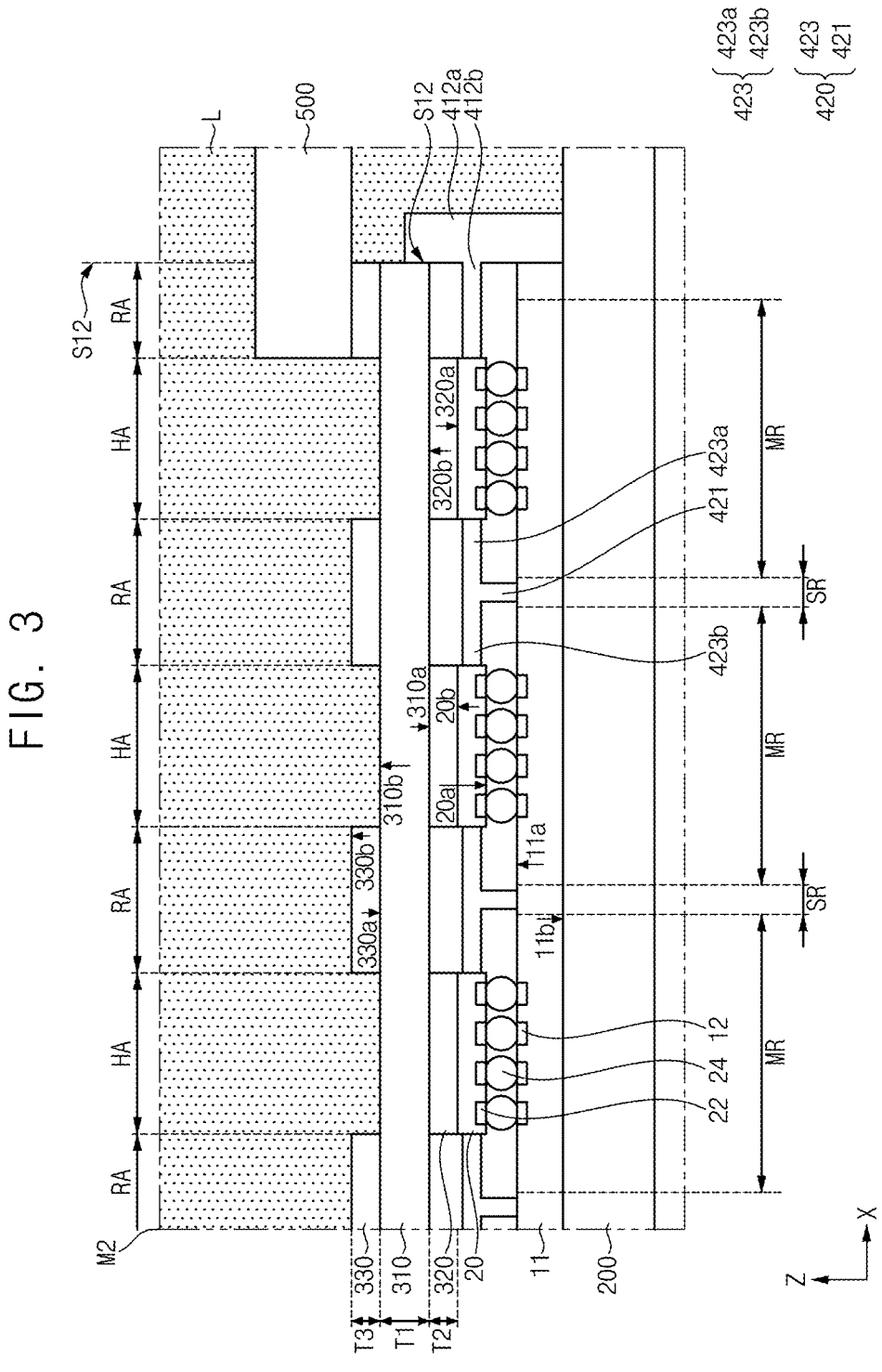

FIG. 3 is an enlarged view illustrating portion 'M2' in FIG. 1 in accordance with some example embodiments.

Figure 4:
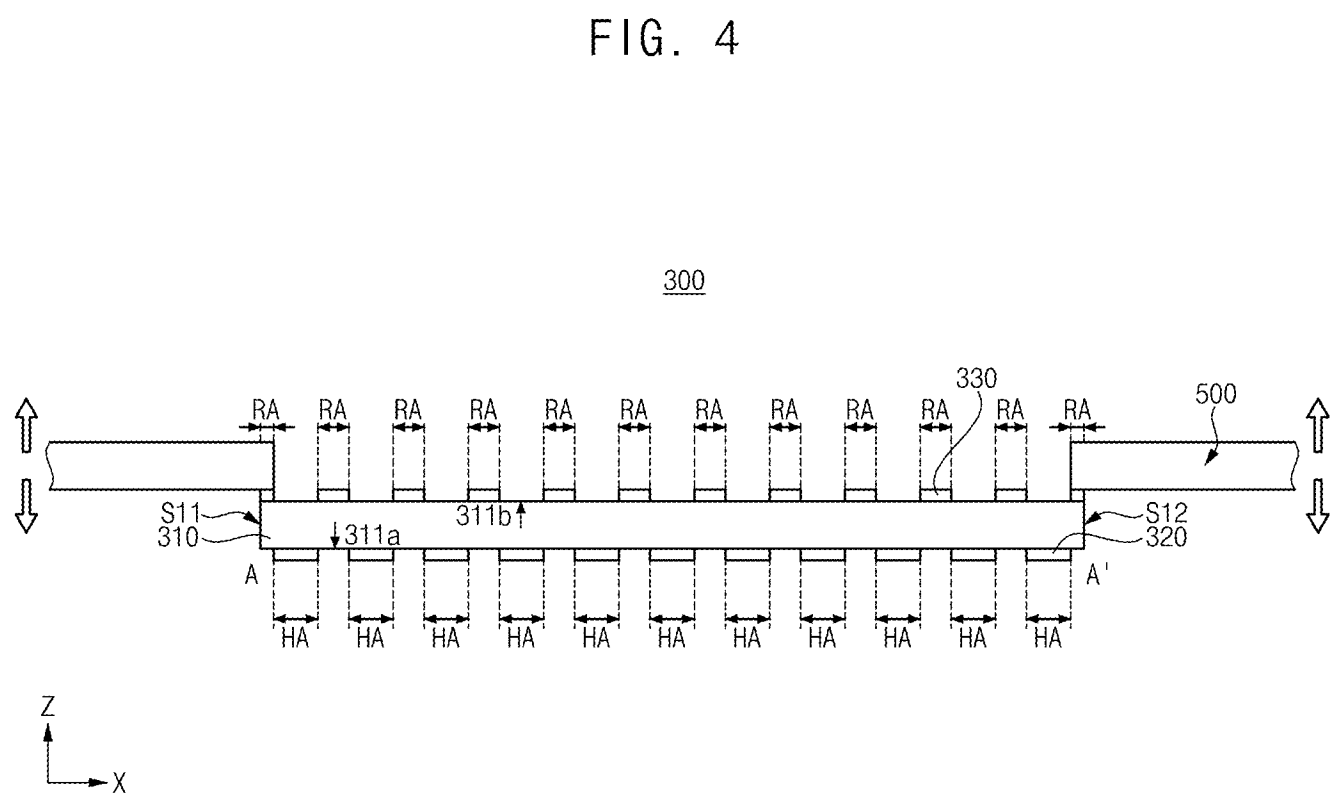

FIG. 4 is a cross-sectional view illustrating a pressurization mask in accordance with some example embodiments.

Figure 5:
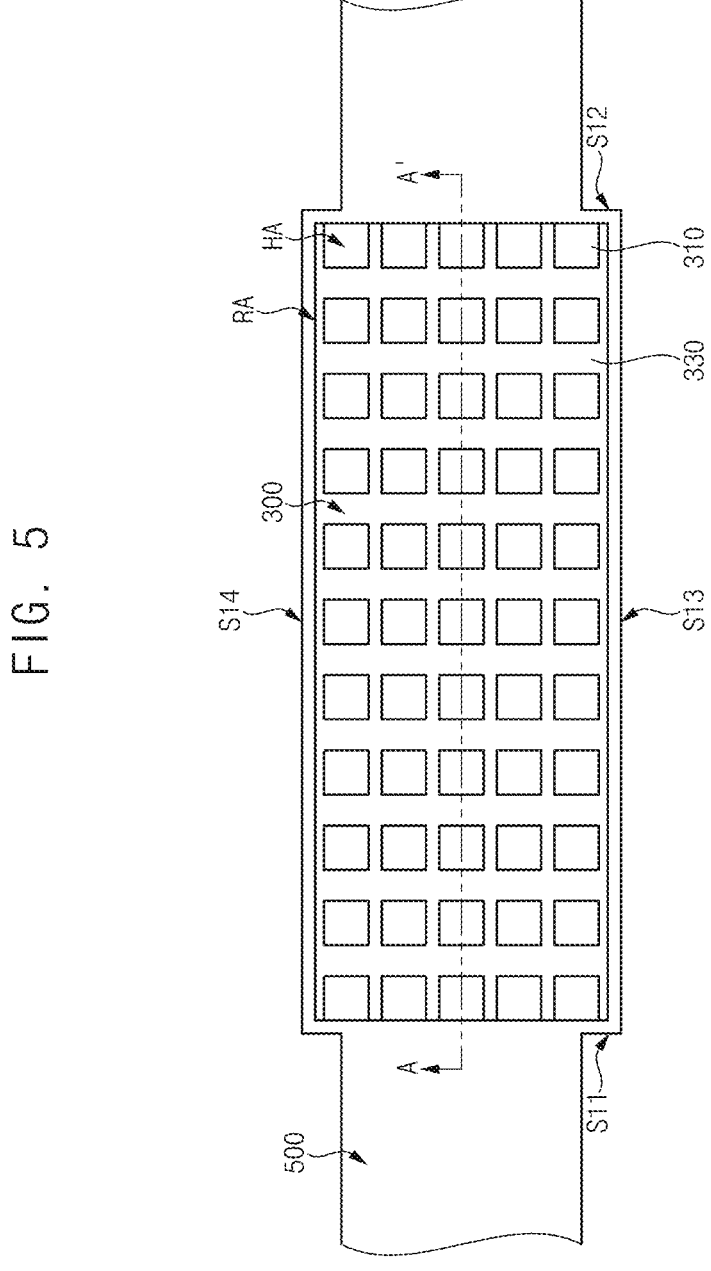
Figure 5:

FIG. 5 is a plan view illustrating a pressurization mask in accordance with some example embodiments.

Figure 6:
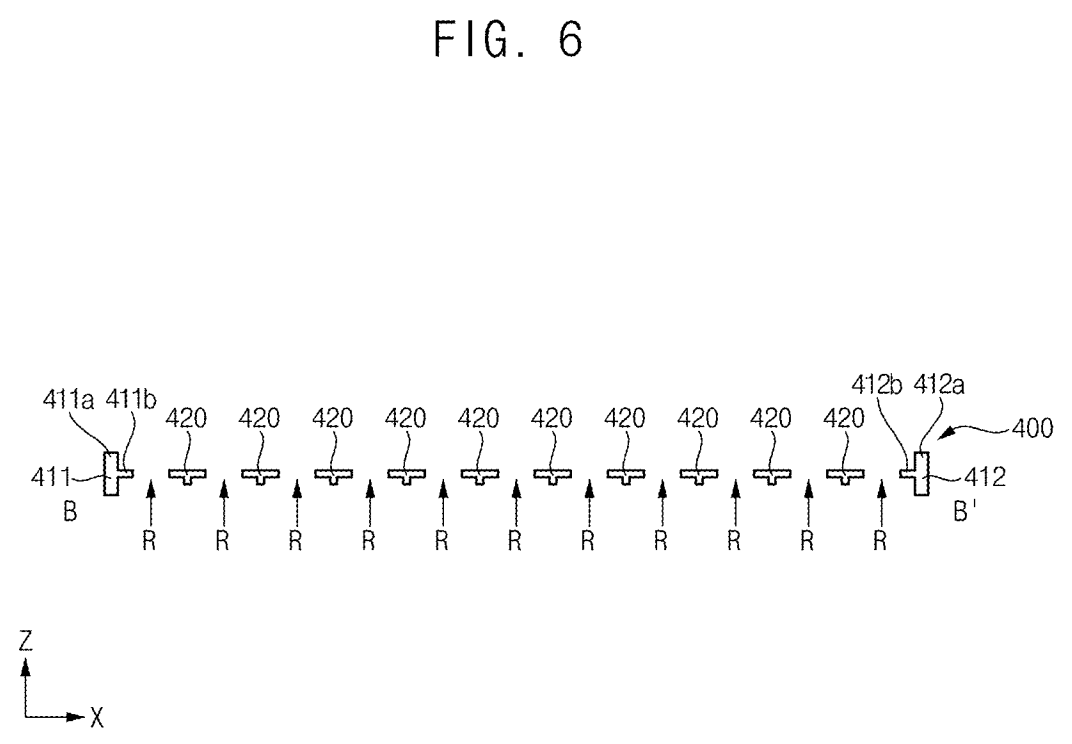

FIG. 6 is a cross-sectional view illustrating a supporting member in accordance with some example embodiments.

Figure 7:
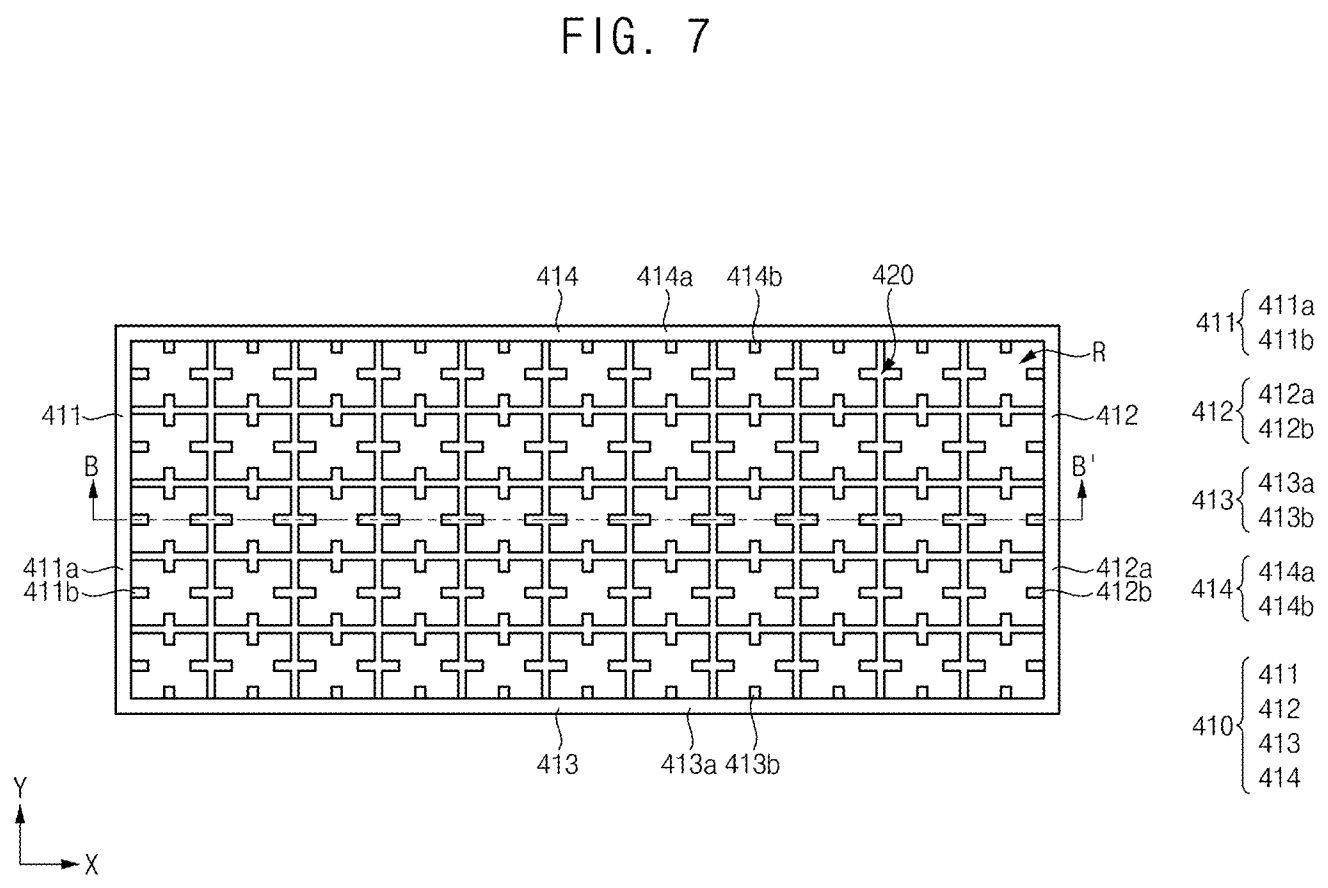

FIG. 7 is a plan view illustrating a supporting member in accordance with some example embodiments.

FIGS. 8, 9, 10, 11, 12, 13, 14, 15, 16, 17, and 18 are views illustrating a method of soldering electronic devices in accordance with some example embodiments.

Figure 19:
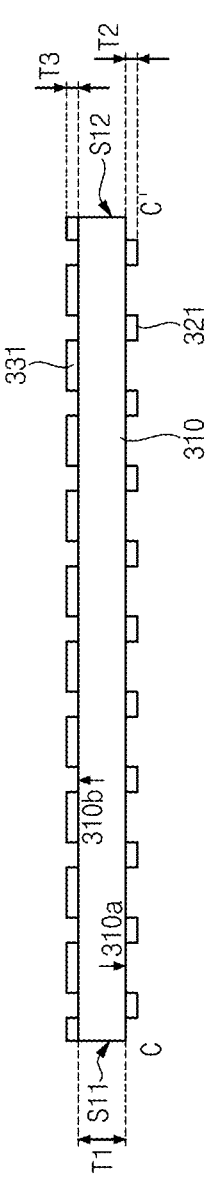
Figure 19:

FIG. 19 is a cross-sectional view illustrating a pressurization mask in accordance with some example embodiments.

Figure 20:
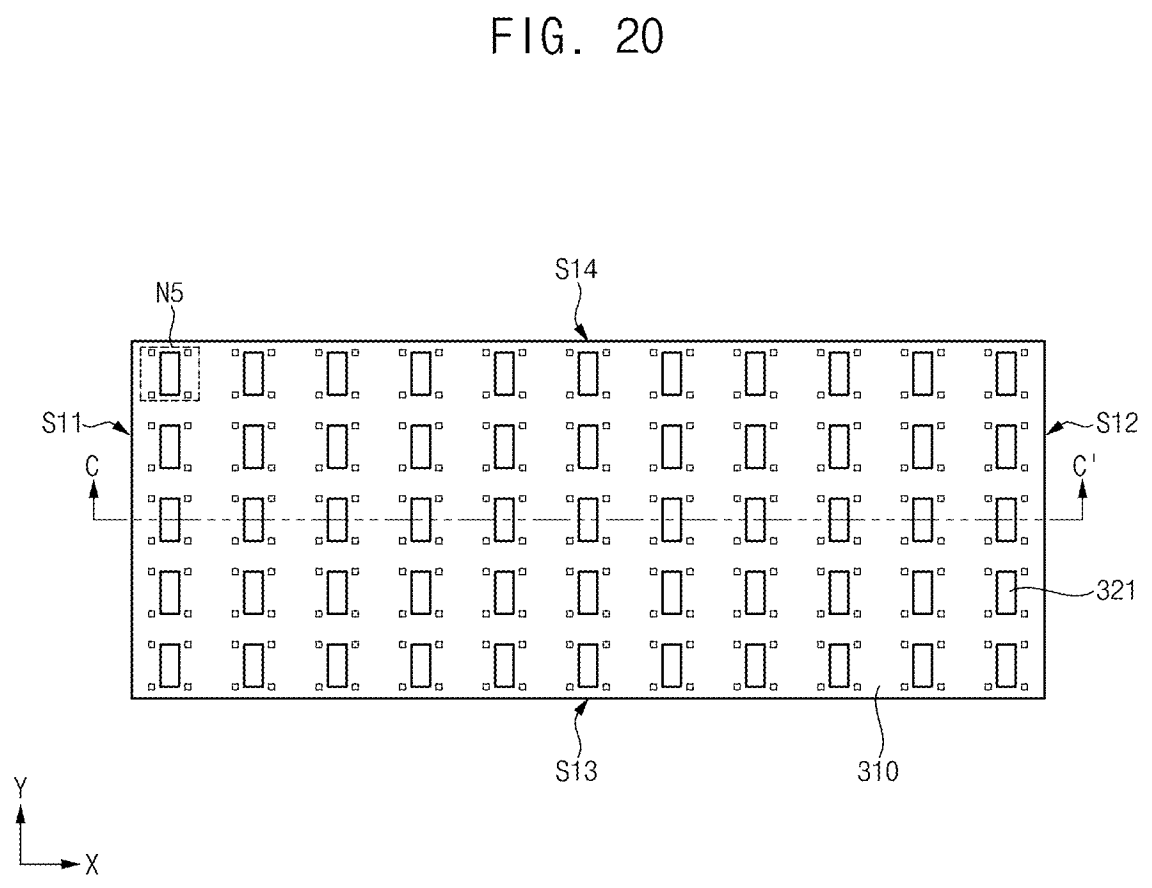

FIG. 20 is a plan view illustrating a pressurization mask in accordance with some example embodiments.

Figure 21:
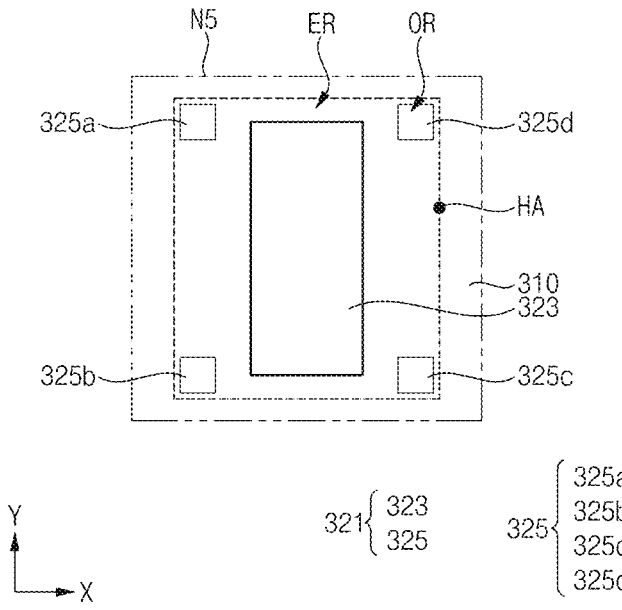

FIG. 21 is an enlarged view illustrating portion 'N5' in FIG. 19.

FIGS. 22, 23, 24, 25, 26, and 27 are views illustrating a method of soldering electronic devices in accordance with some example embodiments.

Figure 28:
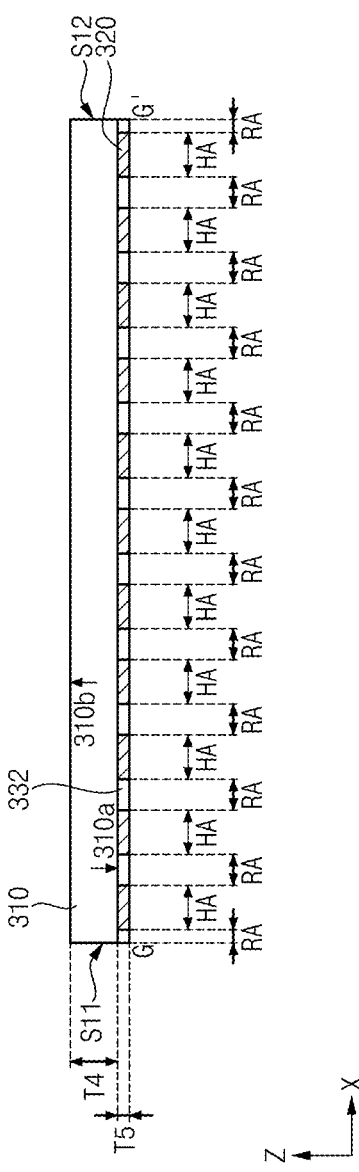

FIG. 28 is a cross-sectional view illustrating a pressurization mask in accordance with some example embodiments.

Figure 29:
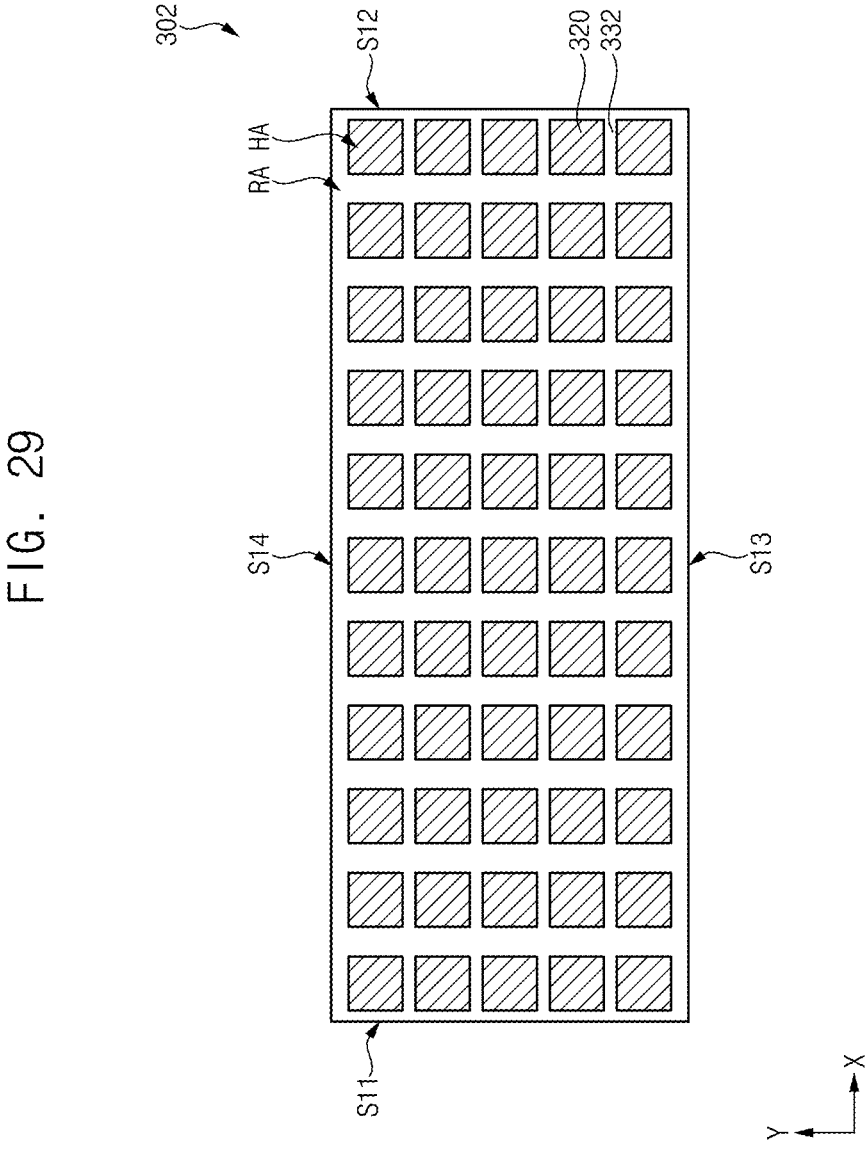

FIG. 29 is a plan view illustrating a pressurization mask in accordance with some example embodiments.

DETAILED DESCRIPTION

Hereinafter, some example embodiments will be explained in detail with reference to the accompanying drawings.

In order to clearly explain the present inventive concepts in the drawings, parts that are not related to the description are omitted, and similar parts are given similar reference numerals throughout the specification. In the flowchart described with reference to the drawings, the order of operations may be changed, several operations may be merged, certain operations may be divided, and certain operations may not be performed.

Additionally, expressions written in the singular may be interpreted as singular or plural, unless explicit expressions such as "one" or "single" are used. Terms containing ordinal numbers, such as first, second, etc., may be used to describe various elements, but the elements are not limited by these terms. These terms may be used for the purpose of distinguishing one component from another.

Throughout the specification, the term "connected" does not mean only that two or more constituent components are directly connected, but may also mean that two or more constituent components are indirectly connected through another constituent component. In addition, unless explicitly described to the contrary, the word "comprise", and variations such as "comprises" or "comprising", will be understood to imply the inclusion of stated elements but not the exclusion of any other elements.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, when an element is referred to as being "above" or "on" a reference element, it can be positioned above or below the reference element, and it is not necessarily referred to as being positioned "above" or "on" in a direction opposite to gravity.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular", "substantially parallel", or "substantially coplanar" with regard to other elements and/or properties thereof will be understood to be "perpendicular", "parallel", or "coplanar", respectively, with regard to the other elements and/or properties thereof within manufacturing tolerances and/or material tolerances and/or have a deviation in magnitude and/or angle from "perpendicular", "parallel", or "coplanar", respectively, with regard to the other elements and/or properties thereof that is equal to or less than 10% (e.g., a. tolerance of 10%).

It will be understood that elements and/or properties thereof may be recited herein as being "identical", "the same", or "equal" as other elements and/or properties thereof, and it will be further understood that elements and/or properties thereof recited herein as being "identical" to, "the same" as, or "equal" to other elements and/or properties thereof may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to, equal to or substantially equal to, and/or the same or substantially the same as other elements and/or properties thereof may be structurally the same or substantially the same, functionally the same or substantially the same, and/or compositionally the same or substantially the same. While the term "same," "equal" or "identical" may be used in description of some example embodiments, it should be understood that some imprecisions may exist. Thus, when one element or property is referred to as being identical to, equal to, or the same as another element or property, it should be understood that the element or property is the same as another element or property within a desired manufacturing or operational tolerance range (e.g., ±10%).

It will be understood that elements and/or properties thereof described herein as being "substantially" the same, equal, and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

FIG. 1 is a plan view illustrating an apparatus for soldering electronic devices in accordance with some example embodiments. FIG. 2 is an enlarged view illustrating portion 'M1' in FIG. 1 in accordance with some example embodiments. FIG. 3 is an enlarged view illustrating portion 'M2' in FIG. 1 in accordance with some example embodiments. FIG. 4 is a cross-sectional view illustrating a pressurization mask in accordance with some example embodiments. FIG. 5 is a plan view illustrating a pressurization mask in accordance with some example embodiments. FIG. 4 is a cross-sectional view taken along the line A-A' in FIG. 5 in accordance with some example embodiments. FIG. 6 is a cross-sectional view illustrating a supporting member in accordance with some example embodiments. FIG. 7 is a plan view illustrating a supporting member in accordance with some example embodiments. FIG. 6 is a cross-sectional view taken along the line B-B' in FIG. 7 in accordance with some example embodiments.

Referring to FIGS. 1 to 7, an apparatus for soldering electronic devices 10 may include a lamp heater 100 configured to irradiate light L, a base plate 200 configured to load a package substrate 11 on which a plurality of semiconductor chips 20 are mounted, and a pressurization mask 300 configured to apply pressure on the package substrate 11 and to selectively block and absorb the light L. Additionally, the apparatus for soldering electronic devices 10 may further include a supporting member 400 configured to support the plurality of semiconductor chips 20 and the pressurization mask 300. Additionally, the apparatus for soldering electronic devices 10 may further include a mask holder 500 configured to move the pressurization mask 300.

For example, the apparatus for soldering electronic devices may be an apparatus that electrically and mechanically connect the package substrate and the plurality of semiconductor chips by applying heat to a plurality of conductive connection members such as solder bumps between the package substrate and the plurality semiconductor chips mounted on the package substrate.

In this specification, a direction in which the light is irradiated may be referred to as a vertical direction (Z direction), and directions perpendicular to the vertical direction (Z direction) and orthogonal to each other may be a first horizontal direction (X direction) and a second horizontal direction (Y direction). In some example embodiments, the vertical direction (Z direction) may be perpendicular to an in-plane direction of the base plate 200, an upper surface 200a of the base plate 200, and/or a lower surface of the base plate 200.

Hereinafter, objects on which soldering processes to be performed by the apparatus for soldering electronic devices 10 according to some example embodiments will be described.

Referring again to FIGS. 1 to 3, objects on which soldering processes are performed may include a package substrate 11 and a plurality of semiconductor chips 20.

In some example embodiments, the package substrate 11 may have a first surface 11a and a second surface 11b extending in the first horizontal direction (X) and facing each other. Additionally, the package substrate 11 may include a plurality of substrate pads 12 exposed from the first surface 11a (e.g., exposed in the vertical direction (Z direction)).

For example, the package substrate 11 may include a plurality of mounting regions MR arranged in a plurality of columns and rows. For example, the package substrate 11 may include a plurality of mounting regions MR and a scribe lane region SR surrounding the plurality of mounting regions MR. For example, a plurality of substrate pads 12 may be provided in each of the plurality of mounting regions MR. For example, the plurality of mounting regions may be regions on which the semiconductor chips are mounted respectively.

For example, the plurality of mounting regions MR of the package substrate 11 may be individualized into individual packages by removing the scribe lane region SR through a sawing process.

In some example embodiments, the plurality of semiconductor chips 20 may be provided on the plurality of mounting regions MR of the package substrate 11 respectively. For example, the plurality of semiconductor chips 20 may be provided on separate, respective mounting regions MR of the plurality of mounting regions MR of the package substrate 11. For example, the plurality of semiconductor chips may include memory devices such as a non-volatile memory device and a volatile memory device. In some example embodiments, the plurality of semiconductor chips may include a logic chip including a logic circuit. For example, the logic chip may be a controller that controls the memory devices.

For example, each semiconductor chip 20 of the plurality of semiconductor chips 20 may have a first surface 20a and a second surface 20b opposite to the first surface 20a. Each semiconductor chip 20 of the plurality of semiconductor chips 20 may include a plurality of chip pads 22 arranged in an array on the first surface 20a of each of the plurality of semiconductor chips 20. Each semiconductor chip 20 of the plurality of semiconductor chips 20 may be mounted on a separate mounting region MR of the package substrate 11 via a separate, respective ("corresponding") plurality of conductive connection members 24 that are respectively provided between the plurality of chip pads 22 and the plurality of substrate pads 12 of the package substrate 11, for example such that the plurality of chip pads 22 of a semiconductor chip 20 may be coupled to separate, respective ("corresponding") substrate pads 12 via separate, respective ("corresponding") conductive connection members 24.

For example, the plurality of conductive connection members 24 may include a conductive material for mechanically and electrically connecting the package substrate 11 and the plurality of semiconductor chips 20. For example, the plurality of conductive connection members 24 may be solder bumps including an alloy of various metals. For example, the plurality of conductive connection members 24 may include silver (Au), copper (Cu), tin (Sn), any combination thereof, etc.

Although the figures only illustrate that the plurality of semiconductor chips mounted on the package substrate by a flip-chip method, the present inventive concepts are not limited thereto. Therefore, the soldering process of the present inventive concepts may be used for a die bonding process such as a chip-to-wafer process in which a chip is mounted on a wafer, a wafer-to-wafer process in which a wafer is mounted on a wafer, etc. Additionally, the soldering process of the present inventive concepts may be used in a soldering process for mounting 3D chips such as high bandwidth memory (HBM) devices.

Hereinafter, the apparatus for soldering electronic devices 10 according to some example embodiments will be described in more detail.

In some example embodiments, the lamp heater 100 may include an irradiation portion 102 (e.g., a light emitting device, a light emitter, a radiation emitter, a light source, a lamp, or the like) configured to irradiate light L (e.g., emit light L) to apply heat to the package substrate 11 and the plurality of semiconductor chips 20 and a housing 104 configured to block the light L from being irradiated to the outside (e.g., an exterior of the apparatus for soldering electronic devices 10).

For example, the lamp heater 100 may be an intense pulsed light (IPL) type laser apparatus device that directly radiates light L for transferring heat. For example, the lamp heater 100 may be a radiation heat transfer apparatus that transfers heat to an object by utilizing multi-wavelength light generated from a light source (irradiation portion 102) as a xenon lamp. Restated, the lamp heater 100 may include an irradiation portion 102 that is a xenon lamp. For example, the lamp heater 100 may irradiate (emit) light L by repeating (e.g., repeatedly alternating between) a first state in which light L is irradiated (ON state) and a second state in which light L is not irradiated (OFF state), for a relatively very short period of time (e.g., alternating between the ON and OFF states at a relatively high frequency).

In some example embodiments, the base plate 200 may be a support structure provided below the lamp heater 100 (e.g., below in the vertical direction) to support and load the package substrate 11 and the plurality of semiconductor chips 20. For example, the package substrate 11 and the plurality of semiconductor chips 20 may be loaded on the base plate 200, for example such that the base plate 200 supports the package substrate 11 (which has the plurality of semiconductor chips 20 thereon) and the weight thereof on an upper surface 200*a* of the base plate 200, and then heated by the light L irradiated from the lamp heater 100. For example, the package substrate 11 on the base plate 200 may be moved to a process region. For example, the base plate 200 may include a heat-resistant material such as ceramics that are configured to withstand heat generated during the soldering process.

Hereinafter, the pressurization mask 300, the supporting member 400, and the mask holder 500 according to some example embodiments will be described.

In some example embodiments, the pressurization mask 300 may include a transparent plate 310 configured to transmit light L irradiated from the lamp heater 100, and a light reflecting pattern 330 configured to reflect the light L, and a plurality of light absorbing patterns 320 configured to absorb the light L.

For example, the pressurization mask 300 may be disposed between the base plate 200 and the lamp heater 100 in the vertical direction (Z direction) to be configured to selectively reflect the light L and absorb the light L irradiated from the lamp heater 100 in the vertical direction (Z direction). Additionally, the pressurization mask 300 may be an apparatus for applying pressure (e.g., configured to apply pressure, for example in the vertical direction (Z direction)) to the plurality of semiconductor chips 20 during the soldering process. For example, the pressurization mask 300 may be provided on the plurality of semiconductor chips 20, and pressure may be applied to the plurality of semiconductor chips 20 by a weight of the pressurization mask 300. In some example embodiments, an additional force may be applied to the pressurization mask 300 to apply additional pressure in addition to the pressure due to the weight of the pressurization mask 300.

For example, as shown for example in FIG. 5, the transparent plate 310 may provide or include first and second side portions S11 and S12 extending in the second horizontal direction (Y direction) to face each other and third and fourth side portions S13 and S14 extending in the first horizontal direction (X direction) facing each other. For example, the transparent plate 310 may include a transparent material such as quartz to transmit the light (e.g., light L that is incident on the transparent plate 310).

The transparent plate 310 may have a first surface 310*a* facing the base plate 200 and a second surface 310*b* facing the lamp heater 100. A plurality of transmission regions HA may be provided (e.g., defined) on the first surface 310*a* of the transparent plate 310 to correspond upper surfaces of the plurality of semiconductor chips 20. A reflection region RA may be provided on the second surface 310*b* of the transparent plate 310, so as not to be overlapped with the plurality of transmission regions HA (e.g., to not overlap with the transmission regions HA in the vertical direction (Z direction), to be offset from the transmission regions in the first and/or second horizontal directions (X direction and/or Y direction), etc.). For example, the plurality of transmission regions HA may be regions through which the light L irradiated from the lamp heater 100 and incident on the transparent plate 310 (e.g., at least a portion of the second surface 310*b* exposed to the lamp heater 100 in the vertical direction (Z direction)) is transmitted through the transparent plate 310 to the first surface 310*a* thereof. The reflection region RA may be a region to which the light L irradiated from the lamp heater 100 and incident on a portion of the pressurization mask 300 is blocked (e.g., blocked from being transmitted through the transparent plate 310 to the first surface 310*a* thereof).

For example, the plurality of light absorbing patterns 320 may be respectively provided on (e.g., at least partially overlapping in the vertical direction (Z direction)) the plurality of transmission regions HA of the transparent plate 310 to be arranged in a plurality of columns and rows. For example, the plurality of light absorbing patterns 320 may be on and/or may at least partially define separate, respective transmission regions HA, including for example at least partially defining one or more boundaries of the separate, respective transmission regions HA in the first and/or second horizontal directions (X direction and/or Y direction). For example, when viewed in a plan view, each of the plurality of light absorbing patterns 320 may have a rectangular shape corresponding to upper surfaces of the plurality of semiconductor chips 20. For example, the plurality of light absorbing patterns 320 may include a material having a high light absorption rate to absorb the light, to provide (e.g., exhibit) a large photothermal effect. Such a material may be referred to herein as an absorbing material. For example, the plurality of light absorbing patterns 320 having the photothermal effect (e.g., may exhibit the photothermal effect and may include a photothermal material) may absorb light L (e.g., light L irradiated, emitted, etc. from the lamp heater 100), and convert the absorbed light L into heat. For example, the plurality of light absorbing patterns 320 may include a black material, a light absorbing material, or the like. For example, the plurality of light absorbing patterns may include an absorbing material (e.g., photothermal material) including a carbon-based material, including for example graphene, fullerene, graphite, carbon nanotubes, carbon black, or the like which may serve as a black material and/or light absorbing material.

For example, the plurality of light absorbing patterns 320 may each include a structure configured to absorb a portion of the light L passing through the plurality of transmission regions HA among the light L irradiated from the lamp heater 100. For example, the plurality of light absorbing patterns 320 may include one or more structures configured to convert the absorbed light L into heat and transfer the heat to a plurality of semiconductor chips 20 in contact with the plurality of light absorbing patterns 320. Additionally, the plurality of light absorbing patterns 320 may include a structure configured to apply pressure along a vertical direction (Z direction) by being in contact with the plurality of semiconductor chips 20. Accordingly, the plurality of light absorbing patterns 320 may transfer heat to the plurality of semiconductor chips 20 (e.g., the plurality of light absorbing patterns 320 may transfer heat to separate, respective ("corresponding") semiconductor chips 20) by converting radiant heat into conductive heat. Additionally, the plurality of light absorbing patterns 320 may reduce, minimize, or prevent warpage from occurring (e.g., from occurring in the package substrate 11) during heat transfer by the applied pressure, thereby reducing the risk of process defects in the package substrate 11 and any electronic devices including same, thereby increasing the yield of electronic devices and improving the reliability of same due to reduced likelihood of process defects resulting from the aforementioned warpage.

Each light absorbing pattern 320 of the plurality of light absorbing patterns 320 may have a first surface 320*a* which may be in contact with a separate, respective ("corresponding") semiconductor chip 20 of the plurality of semiconductor chips 20 and a second surface 320*b* opposite to the first surface 320*a*. The plurality of light absorbing patterns 320 may apply pressure to separate, respective ("correspond-ing") semiconductor chips 20 of the plurality of semicon-ductor chips 20 through respective first surfaces 320*a* of the plurality of light absorbing patterns 320. Additionally, the plurality of light absorbing patterns 320 may transmit heat absorbed from the respective second surfaces 320*b* of each of the plurality of light absorbing patterns 320 to separate, respective ("corresponding") semiconductor chips 20 of the plurality of semiconductor chips 20 through the respective first surfaces 320*a* of the plurality of light absorbing patterns 320.

For example, the light reflecting pattern 330 may be provided on the reflection region RA of the transparent plate 310. The light reflecting pattern 330 may have a first surface 330*a* which may be in contact with the transparent plate 310 (e.g., second surface 310*b* thereof) and a second surface 330*b* opposite to the first surface 330*a* and facing the lamp heater 100. The light reflecting pattern 330 may be provided on the reflection region RA such that the light reflecting pattern 330 is not overlapped with the plurality of light absorbing patterns 320 (e.g., not overlapped in the vertical direction (Z direction)). For example, the light reflecting pattern 330 may be provided on a region of the second surface 310*b* of the transparent plate 310 excluding regions that are overlapped (e.g., in the vertical direction (Z direc-tion)) with the plurality of light absorbing patterns 320. In some example embodiments, the light reflecting pattern 330 may define one or more boundaries of the reflection region RA in the first and/or section horizontal directions (X direction and/or Y direction) wherein the reflection region RA may be defined as one or more regions of the pressur-ization mask 300 overlapping with at least a portion of the light reflecting pattern 330 in the vertical direction (Z direction). In some example embodiments, the light reflect-ing pattern 330 may define one or more boundaries of the transmission regions HA in the first and/or section horizontal directions (X direction and/or Y direction) wherein the transmission regions HA may be defined as one or more regions of the pressurization mask 300 not overlapping (e.g., exposed from) the light reflecting pattern 330 in the vertical direction (Z direction). For example, the light reflecting pattern 330 may include a material with a high light reflec-tivity (e.g., a high reflectance, a high light reflection rate, or a low light absorption rate) in order to reflect the light (e.g., reflect light L that is incident on the second surface 330*b* of the light reflecting pattern 330). Such a material may be referred to herein as a reflective material. For example, the light absorbing patterns 320 may include a material having a first light absorption rate and the light reflecting pattern 330 may include a material with a second light absorption rate that is smaller than the first light absorption rate. For example, the light absorbing patterns 320 may include a material having a first absorbance and the light reflecting pattern 330 may include a material with a second absorbance that is smaller than the first absorbance. In another example, the light absorbing patterns 320 may include a material having a first reflectance and the light reflecting pattern 330 may include a material with a second reflectance that is greater than the first reflectance. In another example, the light absorbing patterns 320 may include a material having a first light reflection rate and the light reflecting pattern 330 may include a material with a second light reflection rate that is greater than the first light reflection rate. For example, the light reflecting pattern 330 may include a white material (e.g., a material exhibiting a white color). For example, the light reflecting pattern 330 may include a reflective material such as a mirror, a glass mirror, silver, aluminum, or the like.

For example, the light reflecting pattern 330 may include a structure configured to block the light L irradiated from the lamp heater 100 from propagating (e.g., in the vertical direction (Z direction)) to a region excluding the regions that are overlapped (in the vertical direction (Z direction)) with the plurality of light absorbing patterns 320. Accordingly, the light reflecting pattern 330 may reduce, minimize, or prevent warpage in at least the package substrate 11 due to the light L irradiated from the lamp heater 100, thereby reducing the risk of process defects in the package substrate 11 and any electronic devices including same, thereby increasing the yield of electronic devices and improving the reliability of same due to reduced likelihood of process defects resulting from the aforementioned warpage.

For example, a thickness of the transparent plate 310 (e.g., in the vertical direction (Z direction)) may be greater than each of at thickness of the plurality of light absorbing patterns 320 and a thickness of the light reflecting pattern 330.

For example, the transparent plate 310 may include a ceramic material such as quartz that is configured to transmit incident light (e.g., light L irradiated on the pressurization mask 300 from the lamp heater 100 in the vertical direction (Z direction)). Therefore, in order to prevent the transparent plate 310 from being broken by external force, or to reduce or minimize the likelihood of such breakage, the thickness of the transparent plate 310 may be relatively larger than each of the thickness of the plurality of light absorbing patterns 320 and the thickness of the light reflecting pattern 330.

For example, the plurality of light absorbing patterns 320 may have a relatively thin thickness in order to be configured to effectively transfer heat to the corresponding semicon-ductor chips 20 of the plurality of semiconductor chips 20 (e.g., to separate, respective semiconductor chips 20 at least partially overlapping with separate, respective ("corre-sponding") light absorbing patterns 320 in the vertical direction (Z direction)). For example, the process time required to transfer heat to the plurality of semiconductor chips 20 may increase in proportion to the thickness of each of the plurality of light absorbing patterns 320. Accordingly, the thickness of each of the plurality of light absorbing patterns 320 may be relatively less (smaller) than the thick-ness of the transparent plate 310.

For example, the transparent plate 310 may have a first thickness T1 (e.g., in the vertical direction (Z direction)), and each of the plurality of light absorbing patterns 320 may have a second thickness T2 (e.g., in the vertical direction (Z direction)), and the light reflecting pattern 330 may have a third thickness T3 (e.g., in the vertical direction (Z direc-tion)). For example, the first thickness T1 may be within a range of 3 mm to 10 mm, and the second thickness T2 and the third thickness T3 may be within a range of 10 μm to 100 μm. For example, the plurality of light absorbing patterns 320 and the light reflecting pattern 330 may be formed on the first surface 310*a* and the second surface 310*b*, respec-tively, of the transparent plate 310 by a screen-printing method. For example, the plurality of light absorbing pat-terns 320 and the light reflecting pattern 330 may be formed by attaching a plating solution to an internal pattern of a frame, wherein the internal pattern corresponds to the plu-rality of light absorbing patterns and the light reflecting pattern. For example, the frame may be a photoresist pattern formed by using an etching process and an exposure process.

Although the figures illustrate a pressurization mask 300 including the plurality of light absorbing patterns 320 configured to absorb the light L and the light reflecting pattern 330 configured to reflect the light L, the present inventive concepts are not limited thereto. For example, the plurality of light absorbing patterns 320 and/or the light reflecting pattern 330 may be omitted.

In some example embodiments, the supporting member 400 may provide a mask frame 410 to maintain the pressurization mask 300 in a horizontal state (e.g., horizontal orientation, for example such that an in-plane direction of the pressurization mask 300, surfaces 310a, 310b, 320a, 320b, or any combination thereof are coplanar with a plane extending in the first and second horizontal directions (X direction and Y direction)), and a chip support portion 420 disposed on the package substrate 11 may be to support (e.g., structurally support, for example support at least a portion of the weight of) the plurality of semiconductor chips 20. For example, the supporting member 400 may include a heat-resistant material such as stainless steel or ceramic that may be configured to withstand the heat applied during the soldering process.

For example, the mask frame 410 includes a plurality of guides 411, 412, 413 and 414 surrounding a plurality of side portions of the package substrate 11 and extending in a vertical direction (Z direction) perpendicular to the first horizontal direction (X direction).

The first to fourth guides 411, 412, 413, and 414 may include first to fourth vertical extension portions 411a, 412a, 413a, and 414a extending in the vertical direction (Z direction). Additionally, the first to fourth guides 411, 412, 413, and 414 may include first to fourth horizontal extension portions 411b, 412b, 413b, and 414b extending in the horizontal direction.

For example, the first to fourth vertical extension portions 411a, 412a, 413a, and 414a may be a structure corresponding to the first to fourth sides S11, S12, S13, and S14 of the transparent plate 310 of the pressurization mask 300 to prevent the pressurization mask 300 from tilting in the horizontal direction (e.g., X direction and/or Y direction), or to reduce or minimize such tilting. For example, when the pressurization mask 300 moves in the vertical direction (Z direction) in a space adjacent to the plurality of semiconductor chips 20, the first to fourth vertical extension portions 411a, 412a, 413a, and 414a may support outer portions of the pressurization mask in order to limit a movement of the pressurization mask 300 in the horizontal direction. Accordingly, the first to fourth vertical extension portions 411a, 412a, 413a, and 414a may help the pressurization mask 300 to maintain horizontal state (e.g., horizontal orientation, for example such that an in-plane direction of the pressurization mask 300, surfaces 310a, 310b, 320a, 320b, or any combination thereof are coplanar with a plane extending in the first and second horizontal directions (X direction and Y direction), are parallel with an upper surface 200a of the base plate 200, or the like) during pressurizing the plurality of semiconductor chips.

For example, the first to fourth horizontal extension portions 411b, 412b, 413b, and 414b may respectively extend from the first to fourth vertical extension portions 411a, 412a, 413a, and 414a to side portions of adjacent semiconductor chips 20 among the plurality of semiconductor chips 20. The first to fourth horizontal extension portions 411b, 412b, 413b, and 414b may fix the adjacent semiconductor chips 20 by limiting movement of the adjacent semiconductor chips 20 in the horizontal direction (e.g., X and/or Y directions).

The chip support portion 420 may include a plurality of vertical ribs 421 extending in the vertical direction (Z direction) and a plurality of horizontal ribs 423 extending in the horizontal direction from the plurality of vertical ribs 421, respectively.

The plurality of vertical ribs 421 may be provided on the first surface 11a of the package substrate 11 to be located in a space exposed (e.g., exposed in the vertical direction (Z direction)) from between the plurality of semiconductor chips 20.

The plurality of horizontal ribs 423 may extend from end portions of the plurality of vertical ribs 421 to semiconductor chips 20 adjacent to the plurality of vertical ribs 421. The plurality of horizontal ribs 423 may be respectively in contact with the end portions of the plurality of semiconductor chips 20 to fix the plurality of semiconductor chips 20 by limiting movement of the plurality of semiconductor chips in the horizontal direction (e.g., X and/or Y directions). The horizontal ribs 423 may include horizontal ribs 423a and 423b which may extend from a same end portion of a same vertical rib 421 e.g., extending in different horizontal directions). Each of the plurality of horizontal ribs 423 may be in contact with end portions of the plurality of semiconductor chips 20 (e.g., each horizontal rib 423 may be in contact with an end portion of one semiconductor chip 20 of the plurality of semiconductor chips 20) to secure the plurality of semiconductor chips 20 by limiting movement of the plurality of semiconductor chips 20 in the horizontal direction (e.g., X and/or Y directions).

In some example embodiments, the mask holder 500 may be secured to a portion of the transparent plate 310 and may move the pressurization mask 300 in the vertical direction (Z direction). For example, the mask holder 500 may be secured to outside portions S11, S12, S13, and S14 of the transparent plate 310, respectively. For example, the mask holder 500 may move the pressurization mask 300 in the vertical direction (Z direction) such that the light absorbing patterns 320 of the pressurization mask 300 make contact with the corresponding semiconductor chips 20 of the plurality of semiconductor chips 20 (e.g., such that the light absorbing patterns 320 make contact with separate, respective semiconductor chips 20) in order to apply pressure P to the plurality of semiconductor chips 20. For example, the mask holder 500 may be secured to the outside portions S11, S12, S13, and S14 of the transparent plate 310 by using a pressure difference, such as a vacuum pickup method.

As described above, the apparatus for soldering electronic devices 10 may include the lamp heater 100 configured to irradiate the light L, the base plate 200 configured to support the package substrate 11, and the pressurization mask 300 configured to pressurize the package substrate 11 and selectively block and absorb the light L. Additionally, the apparatus for soldering electronic devices 10 may include the supporting member 400 configured to support the plurality of semiconductor chips 20 and the pressurization mask 300. Additionally, the apparatus for soldering electronic devices 10 may include the mask holder 500 configured to move the pressurization mask 300.

The pressurization mask may include the transparent plate 310 configured to transmit the light L irradiated from the lamp heater 100, the light reflecting pattern 330 configured to at least partially reflect the light L, and the plurality of light absorbing patterns 320 to at least partially absorb the light L. The plurality of light absorbing patterns 320 may absorb the light L passing through the transparent plate 310 and may transfer heat that is generated (e.g., generated in the plurality of light absorbing patterns 320) from the absorbed light L to the plurality of semiconductor chips 20 (e.g., the plurality of light absorbing patterns 320 may transfer heat generated therein to separate, respective ("corresponding") semiconductor chips 20 with which the plurality of light absorbing patterns 320 are in contact). Additionally, the light reflecting pattern 330 may block the light L from being irradiated to regions of the package substrate 11 excluding the plurality of chip mounting regions MR (e.g., regions not vertically overlapping and/or regions horizontally offset from the plurality of chip mounting regions MR). Additionally, the plurality of light absorbing patterns 320 may make contact with the plurality of semiconductor chips 20 to apply pressure to the plurality of semiconductor chips 20.

Accordingly, the apparatus for soldering electronic devices 10 may transfer heat to each semiconductor chip 20 of the plurality of semiconductor chips 20 through a separate, respective light absorbing pattern 320 by using a conductive heat transfer method. Thus, an efficiency of heat transfer to the semiconductor chip 20 (e.g., an efficiency of heat transfer based on light L being irradiated from a lamp heater 100) may be increased, thereby enabling the apparatus for soldering electronic devices 10 to be configured to implement soldering operations (e.g., soldering using an intense pulsed light (IPL) method) with reduced radiant energy transmission requirements and thus with reduced power consumption by the lamp heater 100 to emit light L, and thus reduced power consumption by the apparatus for soldering electronic devices 10, to implement the soldering.

Additionally, the apparatus for soldering electronic devices 10 may block the light L from being irradiated to regions other than the mounting regions MR through the light reflecting pattern 330. Accordingly, it may be possible to reduce, minimize, or prevent warpage from occurring in at least the package substrate 11 due to radiant energy. Further, the apparatus for soldering electronic devices 10 may directly reduce, minimize, or prevent warpage from occurring in the package substrate 11 by applying pressure to the package substrate 11 by using the pressurization mask 300.

Additionally, the apparatus for soldering electronic devices may reduce, minimize, or prevent the plurality of semiconductor chips 20 and the pressurization mask 300 from being tilted (e.g., tilted away from extending in a horizontal plane extending in the X and Y directions) while the apparatus for soldering electronic devices 10 is applying pressure to the plurality of semiconductor chips 20.

Hereinafter, a method of soldering electronic devices using the apparatus for soldering electronic devices 10 according to some example embodiments will be described.

Figure 8:
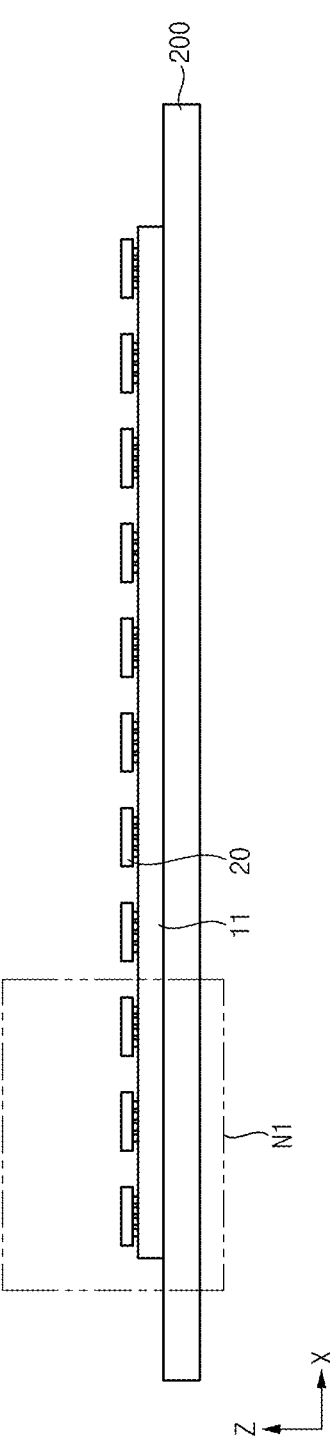
Figure 9:
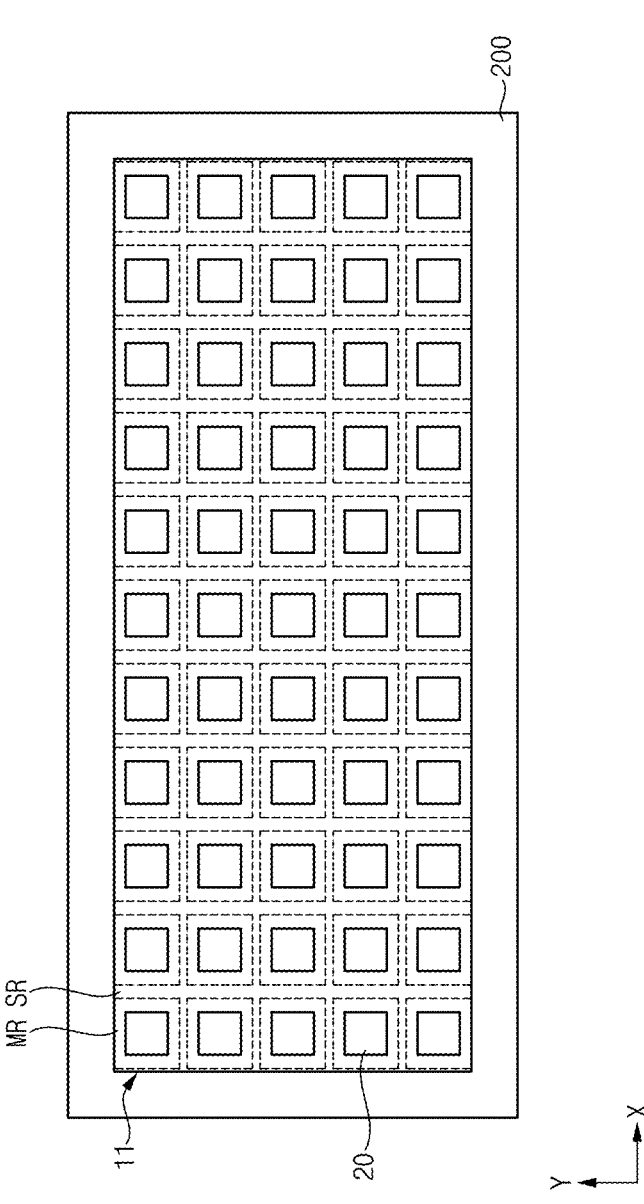
Figure 10:
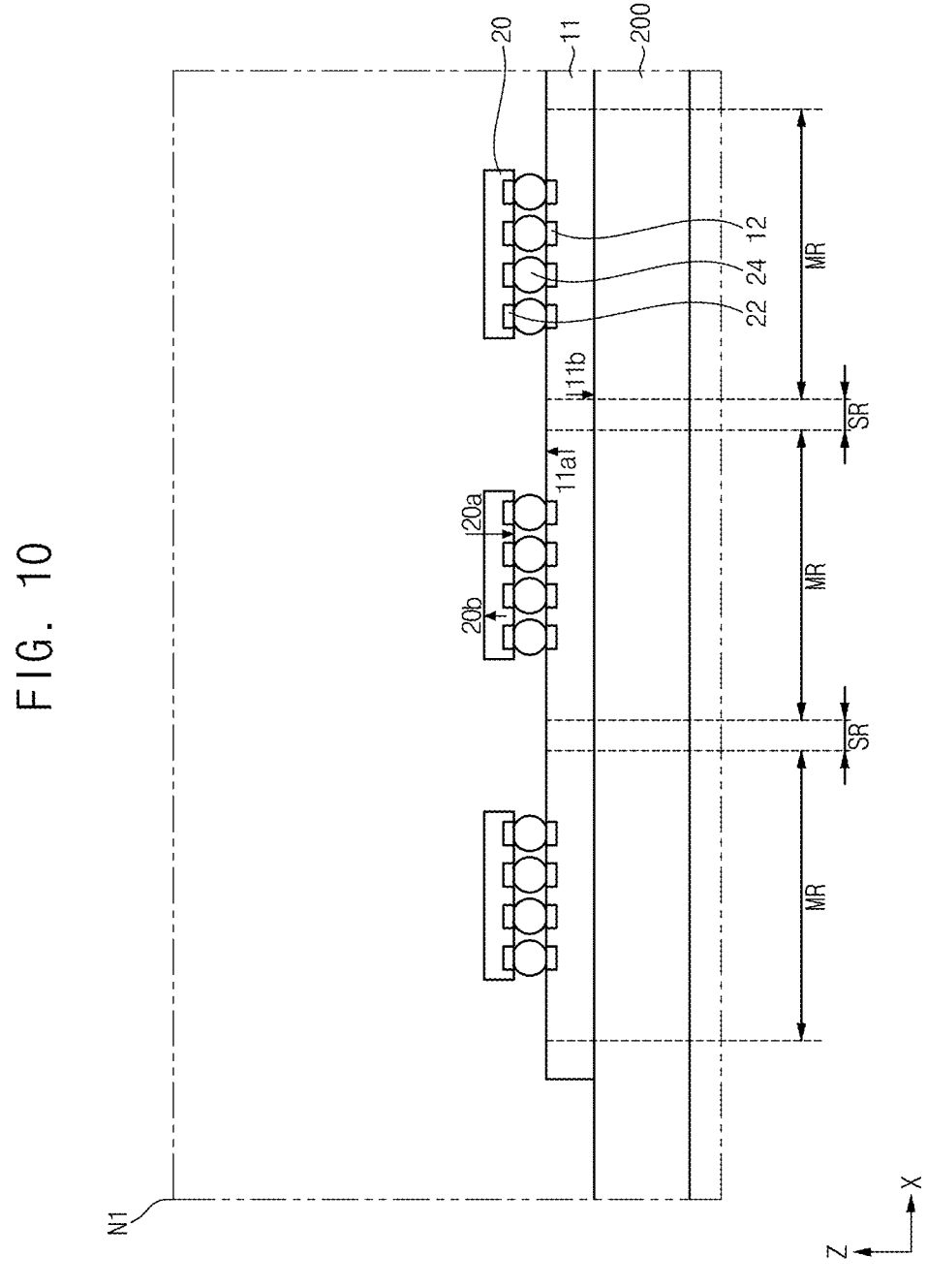
Figure 11:
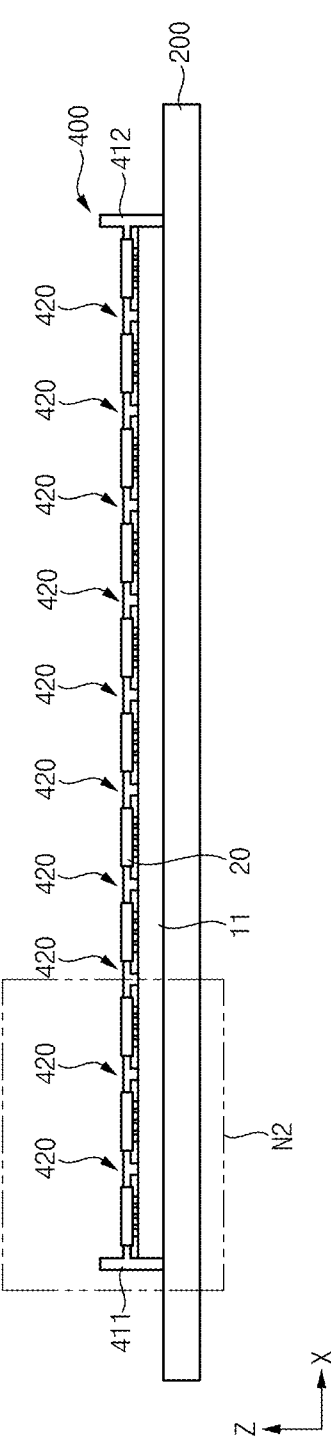
Figure 14:
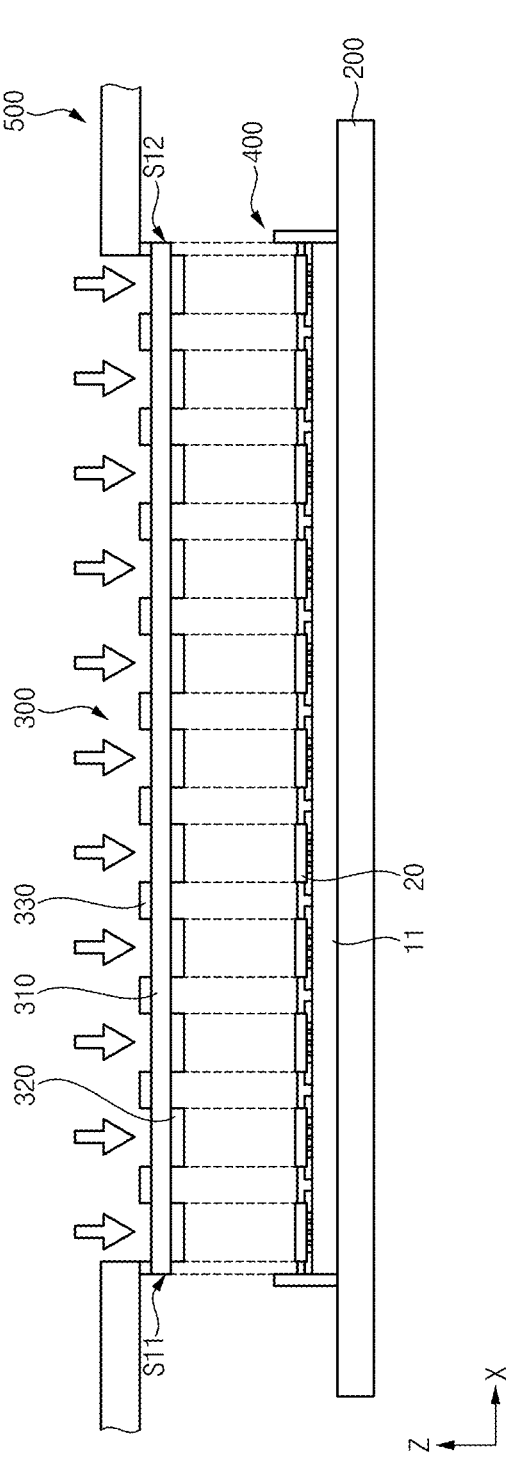
Figure 15:
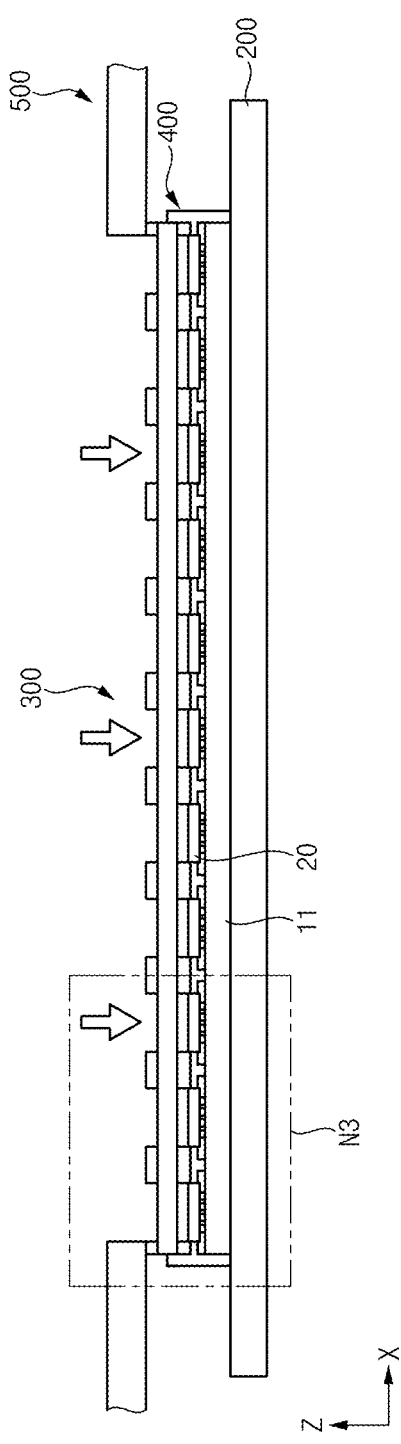
Figure 16:
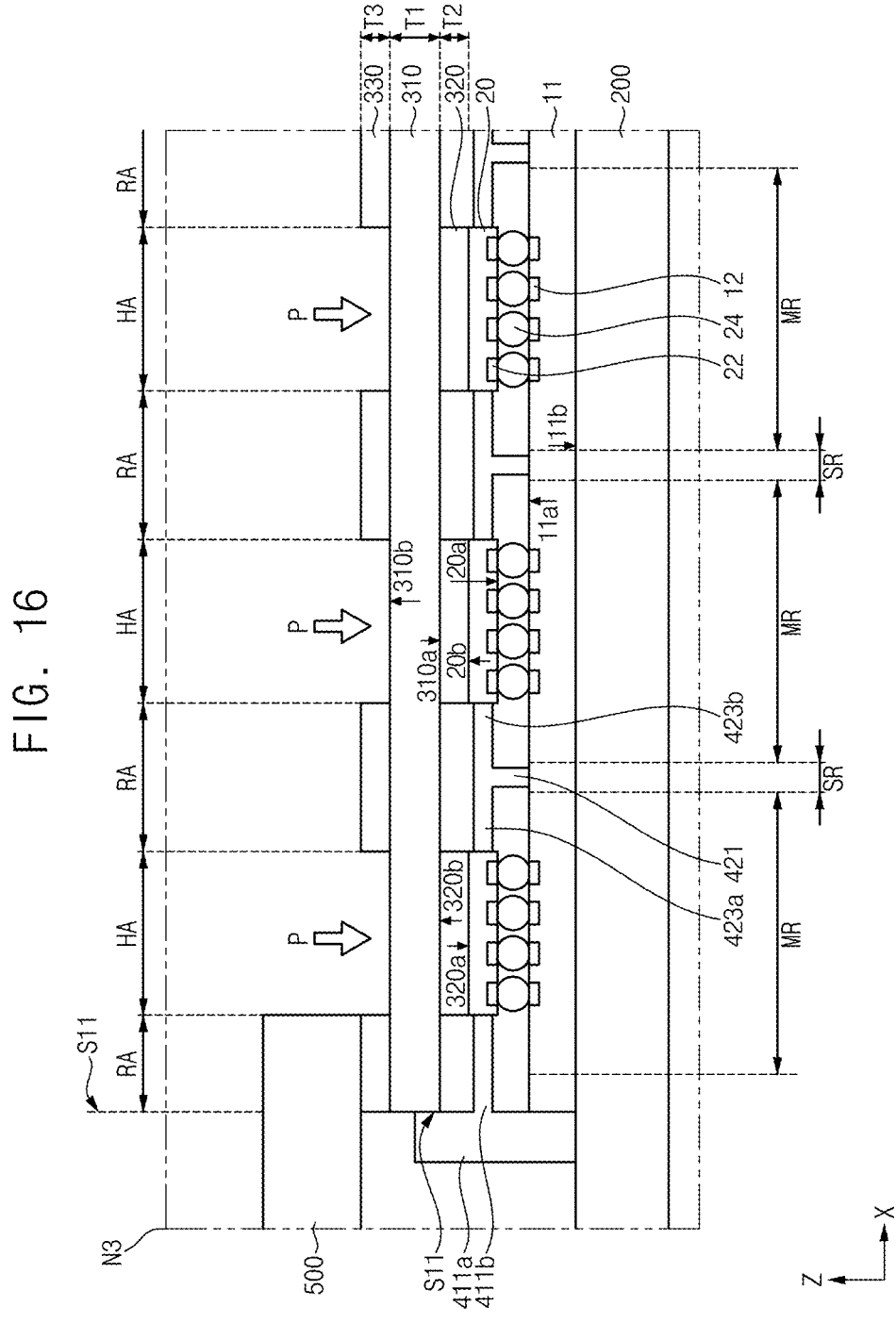
Figure 17:
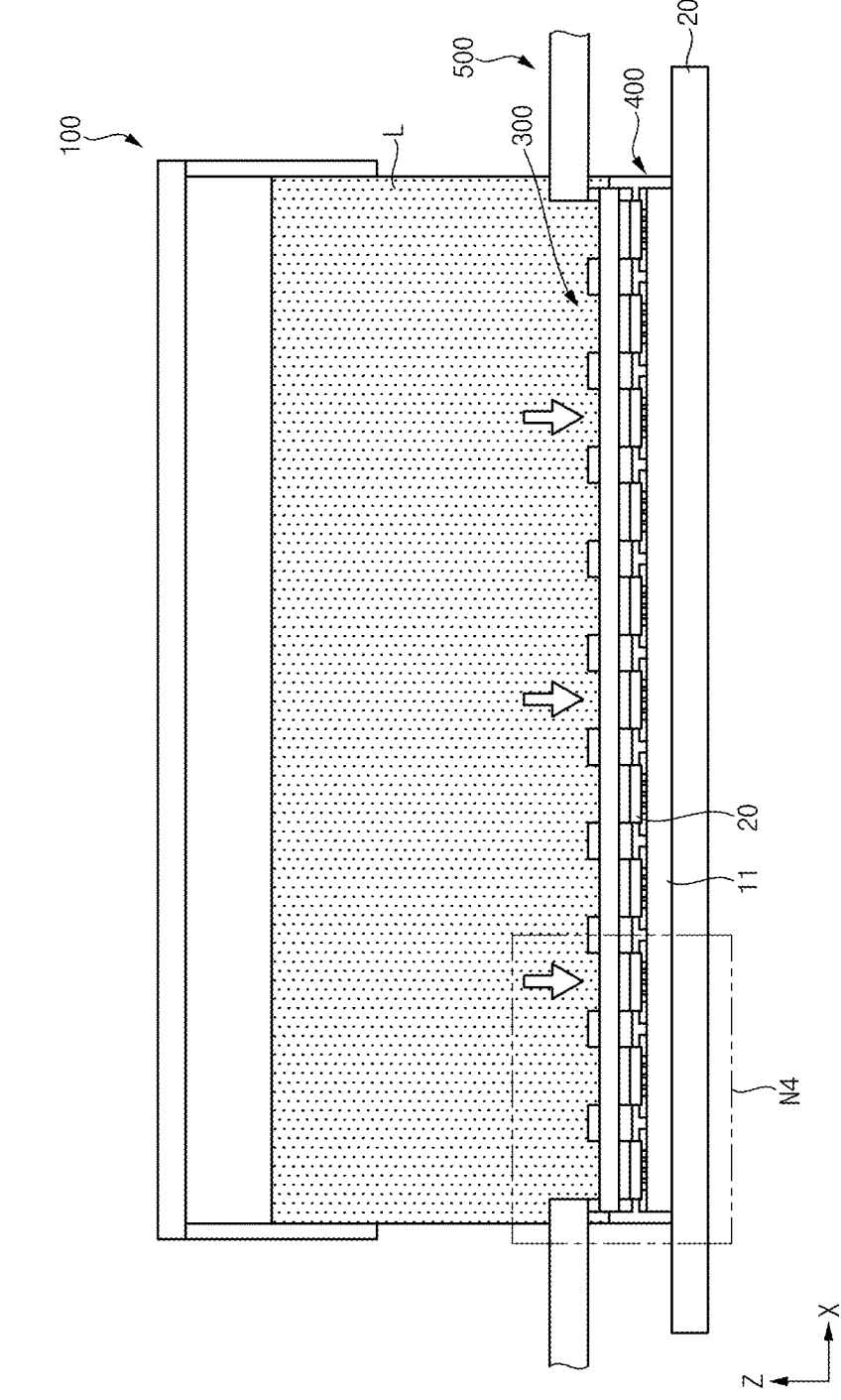
Figure 18:
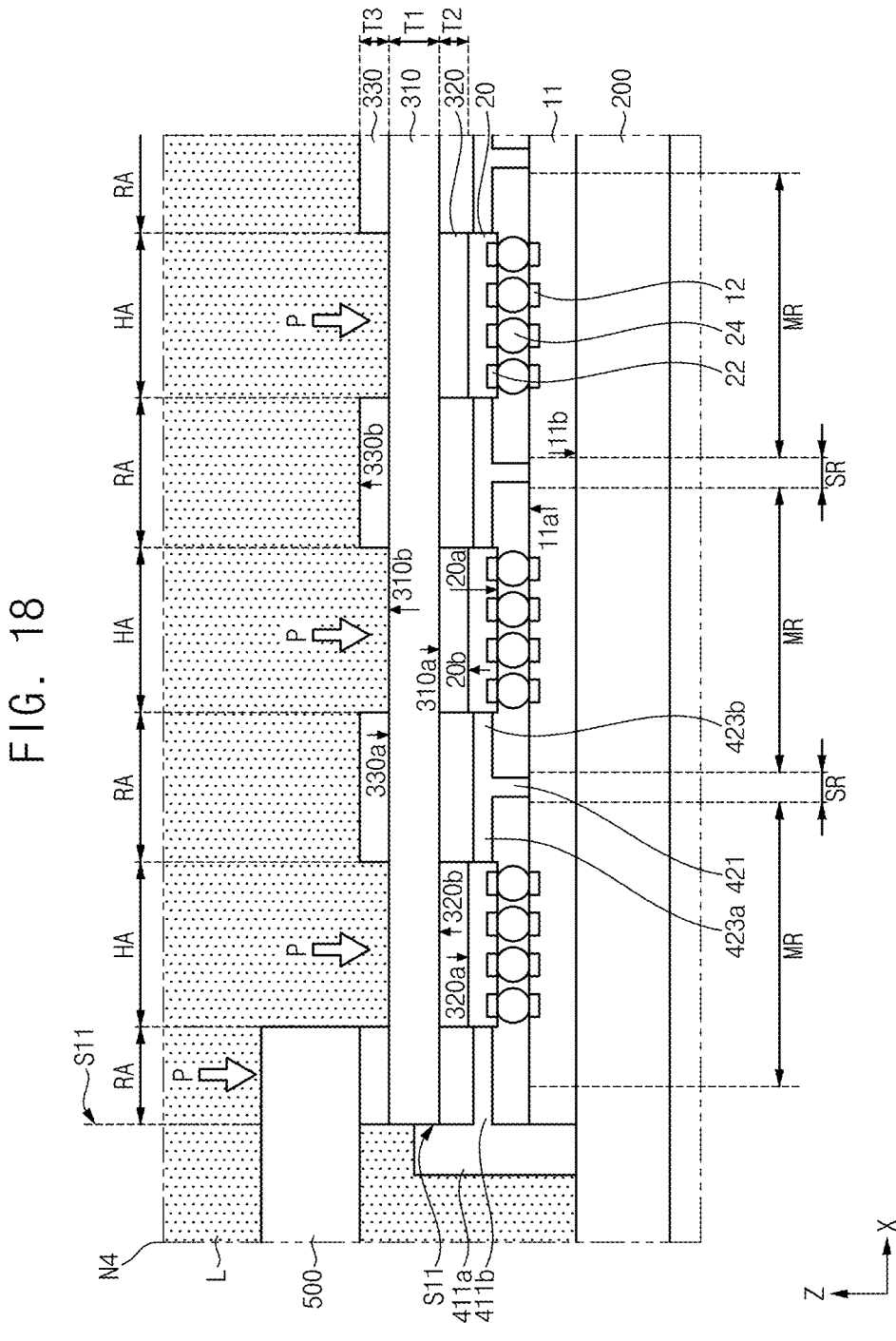

FIG. 8 is a cross-sectional view illustrating a package substrate provided on a base plate, wherein a plurality of semiconductor chips are mounted on the package substrate in accordance with some example embodiments. FIG. 9 is a plan view illustrating the package substrate in FIG. 8 in accordance with some example embodiments. FIG. 10 is an enlarged view illustrating portion 'N1' in FIG. 8 in accordance with some example embodiments. FIG. 11 is a cross-sectional view illustrating a supporting member that secures the plurality of semiconductor chips in accordance with some example embodiments. FIG. 12 is a plan view illustrating the supporting member in FIG. 11 in accordance with some example embodiments. FIG. 13 is an enlarged view illustrating portion 'N2' in FIG. 11 in accordance with some example embodiments. FIG. 14 is a cross-sectional view illustrating that a pressurization mask is aligned with the plurality of semiconductor chips in accordance with some example embodiments. FIG. 15 is a cross-sectional view illustrating that the pressurization mask is placed on a plurality of semiconductor chips along the supporting member in accordance with some example embodiments. FIG. 16 is an enlarged view illustrating portion 'N3' in FIG. 15 in accordance with some example embodiments. FIG. 17 is a cross-sectional view illustrating that light is irradiated on the pressurization mask in accordance with some example embodiments. FIG. 18 is an enlarged view illustrating portion 'N4' in FIG. 17 in accordance with some example embodiments.

Referring again to FIGS. 1 to 7, an apparatus for soldering electronic devices 10 according to some example embodiments, a package substrate 11, and a plurality of semiconductor chips 20 may be provided. Since, in a method of soldering electronic devices according to some example embodiments, an apparatus for soldering electronic devices 10, a package substrate 11, and a plurality of semiconductor chips 20 are the same or substantially the same as the apparatus for soldering electronic devices 10, the package substrate 11, and the plurality of semiconductor chips 20 described in FIGS. 1 and 7, so repeated description of the same components will be omitted.

Referring to FIGS. 8 to 10, a package substrate 11 including a plurality of semiconductor chips 20 mounted in a plurality of columns rows thereon may be loaded on a base plate 200 and may be supported on the base plate 200, for example such that the base plate 200 supports the weight of the package substrate 11 and the plurality of semiconductor chips 20 mounted thereon.

For example, the plurality of semiconductor chips 20 may be mounted respectively on mounting regions MR arranged in a plurality of columns and rows. Each semiconductor chip 20 of the plurality of semiconductor chips 20 may be mounted on the package substrate 11 via a separate plurality of conductive connection members 24. For example, the plurality of conductive connection members 24 connecting the plurality of semiconductor chips 20 and the package substrate 11 may be an object for a soldering process according to some example embodiments.

Referring to FIGS. 11 to 13, a supporting member 400 may be disposed on the base plate 200 and the package substrate 11 to support the package substrate 11 and the plurality of semiconductor chips 20.

A mask frame 410 of the supporting member 400 may be seated on the base plate 200 to surround side portions of the package substrate 11. For example, each of first to fourth guides 411, 412, 413, and 414 of the mask frame 410 may be disposed on the base plate 200 to be in contact with at least one of the side portions of the package substrate 11 in order to support the package substrate 11.

For example, the first to fourth guides 411, 412, 413, and 414 may include first to fourth vertical extension portions 411a, 412a, 413a, and 414a extending in the vertical direction (Z direction) and first to fourth horizontal extension portions 411b, 412b, 413b, and 414b extending in the horizontal direction (X and/or Y directions).

For example, the first to fourth horizontal extension portions 411b, 412b, 413b, and 414b may extend to side portions of a plurality of semiconductor chips 20 from the first to fourth vertical extension portions 411a, 412a, 413a, and 414a. Accordingly, the first to fourth horizontal extension portions 411b, 412b, 413b, and 414b may limit movement of the plurality of adjacent semiconductor chips 20 in the horizontal direction to secure the plurality of adjacent semiconductor chips 20.

A chip support portion 420 of the supporting member 400 may be disposed on the first surface 11a of the package substrate 11 to be located in a space exposed from between
the plurality of semiconductor chips 20. For example, the
chip support portion 420 may include a plurality of hori-
zontal ribs 423 configured to respectively support side
portions of the plurality of semiconductor chips 20. The
supporting member 400 may be disposed on the package
substrate 11 so that each of the plurality of horizontal ribs
423 is in contact with side portions of the plurality of
semiconductor chips 20.

For example, the chip support portion 420 may include
the plurality of vertical ribs 421 extending in a vertical
direction (Z direction) and the plurality of horizontal ribs
423 respectively extending in a horizontal direction from the
plurality of vertical ribs 421.

For example, the plurality of horizontal ribs 423 may
extend from end portions of the plurality of vertical ribs 421
to semiconductor chips adjacent to the plurality of vertical
ribs 421. The horizontal ribs 423 may include horizontal ribs
423a and 423b which may extend from a same end portion
of a same vertical rib 421 e.g., extending in different
horizontal directions). Each of the plurality of horizontal
ribs 423 may be in contact with end portions of the plurality
of semiconductor chips 20 (e.g., each horizontal rib 423 may
be in contact with an end portion of one semiconductor chip
20 of the plurality of semiconductor chips 20) to secure the
plurality of semiconductor chips 20 by limiting movement
of the plurality of semiconductor chips 20 in the horizontal
direction (e.g., X and/or Y directions).

Referring to FIGS. 14 to 16, a pressurization mask 300
may be provided, wherein the pressurization mask is con-
figured to selectively block, transmit, and/or absorb light.
The pressurization mask 300 may be aligned such that a
plurality of light absorbing patterns 320 of the pressurization
mask 300 correspond to a plurality of semiconductor chips
20 (e.g., such that the plurality of light absorbing patterns
320 of the pressurization mask 300 at least partially overlap
with separate, respective semiconductor chips 20 in the
vertical direction). After that, the pressurization mask 300
may be moved in the vertical direction (Z direction) by using
the mask holder 500 to locate the pressurization mask 300 on
the plurality of semiconductor chips 20. Additionally, pres-
sure may be applied to the plurality of semiconductor chips
20 through the pressurization mask 300.

First, the pressurization mask 300 may be provided, the
pressurization mask 300 having a transparent plate 310, a
plurality of light absorbing patterns 320, and a light reflect-
ing pattern 330 configured to selectively block, transmit,
and/or absorb the light.

The plurality of light absorbing patterns 320 of the
pressurization mask 300 may be provided in regions corre-
sponding to the plurality of semiconductor chips 20. For
example, when viewed in a plan view, the plurality of light
absorbing patterns 320 may be provided on regions at least
partially overlapped or entirely overlapped in the vertical
direction Z with the plurality of semiconductor chips 20
(e.g., with separate, respective ("corresponding") semicon-
ductor chips 20) among the first surface 310a of the trans-
parent plate 310.

The light reflecting pattern 330 of the pressurization mask
300 may be provided in a region excluding the regions that
correspond to (e.g., at least partially overlap in the vertical
direction with) the plurality of semiconductor chips 20. For
example, when viewed in a plan view, the light reflecting
pattern 330 may be provided on a region excluding the
regions that are overlapped in the vertical direction (Z
direction) with the plurality of semiconductor chips among
the second surface 310b of the transparent plate 310.

Next, the pressurization mask 300 may be aligned so that
the plurality of light absorbing patterns 320 of the pressur-
ization mask 300 are respectively aligned with the plurality
of semiconductor chips 20 located below (e.g., so that the
plurality of light absorbing patterns 320 of the pressurization
mask 300 at least partially overlap separate, respective
("corresponding") semiconductor chips 20 in the vertical
direction). Thereafter, the pressurization mask 300 may be
moved in the vertical direction (Z direction) by using the
mask holder 500 to a space adjacent to the plurality of
semiconductor chips 20. For example, the mask holder 500
may be secured to a portion of the transparent plate 310 and
move the pressurization mask 300 in the vertical direction (Z
direction). For example, the mask holder 500 may be
secured to the outside portions S11, S12, S13, and S14 of the
transparent plate 310, respectively. For example, the mask
holder 500 may be secured to the outside portions S11, S12,
S13, and S14 of the transparent plate 310 by using a pressure
difference, such as a vacuum pickup method.

In the space adjacent to the plurality of semiconductor
chips 20, the pressurization mask 300 may be supported by
the mask frame 410 of the supporting member 400 to be
disposed on the plurality of semiconductor chips 20.

For example, the first to fourth vertical extension portions
411a, 412a, 413a, and 414a of the mask frame 410 may
include structures configured to support and/or contact the
first to fourth side portions S11, S12, S13, and S14 of the
transparent plate 310 in order to prevent the pressurization
mask 300 from being tilted in the horizontal direction, or to
reduce or minimize such tilting. For example, when the
pressurization mask 300 moves in the vertical direction (Z
direction) in the space adjacent (e.g., adjacent in the vertical
direction) to the plurality of semiconductor chips 20, the first
to fourth vertical extension portions 411a, 412a, 413a, and
414a may limit the movement of the pressurization mask
300 in the horizontal direction (e.g., X and/or Y directions).
Thus, the first to fourth vertical extension portions 411a,
412a, 413a, and 414a may introduce the pressurization mask
while the pressurization mask 300 remains horizontal (e.g.,
in a horizontal state, horizontal orientation, or the like, for
example such that an in-plane direction of the pressurization
mask 300, surfaces 310a, 310b, 320a, 320b, or any combi-
nation thereof are coplanar with a plane extending in the first
and second horizontal directions (X direction and Y direc-
tion), parallel with an upper surface 200a of the base plate
200, or the like).

Next, the plurality of light absorbing patterns 320 of the
pressurization mask 300 may be in contact with the plurality
of semiconductor chips 20 (e.g., the plurality of light absorb-
ing patterns 320 may be in contact with separate, respective
semiconductor chips 20) to apply pressure to the plurality of
semiconductor chips 20. For example, a first pressure may
be applied to the plurality of semiconductor chips 20 by
gravity generated by the weight of the pressurization mask
300. In some example embodiments, a second pressure
greater than the first pressure may be applied to the plurality
of semiconductor chips 20 by applying additional force in
the vertical direction (Z direction) to the pressurization mask
300 by using the mask holder 500. Accordingly, warpage
that occurs during the soldering process may be reduced,
minimized, or prevented.

Referring to FIGS. 17 and 18, a light L may be radiated
(e.g., irradiated, emitted, etc.) from the lamp heater 100 to
the pressurization mask 300 (e.g., in the vertical direction).
In addition, heat may be selectively transferred only to the
plurality of semiconductor chips 20 through the pressuriza-
tion mask 300 (e.g., via separate, respective light absorbing patterns 320), thereby completing the soldering process according to some example embodiments.

Portions of the light L irradiated from the lamp heater 100 to the pressurization mask 300 may be reflected by the light reflecting pattern 330 of the pressurization mask 300, so the portion of the light L irradiated to be incident on the reflection region RA may be blocked by the light reflecting patterns 330 from being transmitted through the pressurization mask 300 to the semiconductor chips 20 and/or the package substrate 11. For example, a region excluding the mounting regions MR of the package substrate 11 may be overlapped (e.g., in the vertical direction) with the light reflecting pattern 330 of the pressurization mask 300. Accordingly, the light L may be blocked from being transmitted to the package substrate 11 in the region of the package substrate 11 excluding the mounting region MR by the light reflecting pattern 330.

A portion of the light L irradiated from the lamp heater 100 to the pressurization mask 300 (e.g., a portion of the light L incident on the separate, respective portions of the second surface 310b of the transparent plate 310 that are exposed from the light reflecting pattern 330 in the vertical direction Z and which may at least partially define the transmission regions HA) may be passed (transmitted) through the transparent plate 310 of the pressurization mask 300 in the vertical direction to the separate, respective upper surfaces (second surfaces 320b) of the plurality of light absorbing patterns 320 which may at least partially overlap with the separate, respective exposed portions of the second surface 310b in the vertical direction as shown in at least FIG. 18. Such transmitted light L that is transmitted to the separate, respective upper surfaces (second surfaces 320b) of the light absorbing patterns 320 via the transparent plate 310 may be referred to as reached light L. The reached light L may be absorbed by the plurality of light absorbing patterns 320 as absorbed light. The absorbed light may be converted into heat in the plurality of light absorbing patterns 320, and the heat may be transmitted from lower surfaces 320a of the plurality of light absorbing patterns 320 that are in contact with the plurality of semiconductor chips 20 to upper surfaces (second surfaces 20b) of the plurality of semiconductor chips 20 (e.g., heat generated in a given light absorbing pattern 320 of the plurality of light absorbing patterns 320 may be transmitted, via a lower surface 320a of the given light absorbing pattern 320 to a separate, respective ("corresponding") semiconductor chip 20 that is in contact with the given light absorbing pattern 320 via the upper surface (second surface 20b) of the semiconductor chip 20 that is contacting the lower surface 320a of the given light absorbing pattern 320). Accordingly, each of the plurality of light absorbing patterns 320 may transfer heat energy to a separate, respective semiconductor chip 20 of the plurality of semiconductor chips 20 by converting a radiative heat transfer method into a conductive heat transfer method.

Accordingly, the plurality of light absorbing patterns 320 and the light reflecting pattern 330 of the pressurization mask 300 may block the light L irradiated to the package (e.g., block light L irradiated onto the pressurization mask 300 at regions that are exposed from the semiconductor chips 20 in the vertical direction), and may selectively transmit the light irradiated onto the plurality of semiconductor chips 20. Additionally, a method for transferring heat energy to the plurality of semiconductor chips 20 may be converted through the plurality of light absorbing patterns 320 of the pressurization mask 300 for efficiently transferring heat. Therefore, heat may be selectively transferred only to a plurality of semiconductor chips 20 by the soldering method according to some example embodiments.

Although the figures illustrated that the plurality of semiconductor chips 20 are mounted on the package substrate 11 by using a flip-chip method, the present inventive concepts are not limited thereto. Therefore, the soldering process of the present inventive concepts may be used for a die bonding process such as a chip-to-wafer process in which a chip is mounted on a wafer, a wafer-to-wafer process in which a wafer is mounted on a wafer, etc. Additionally, the soldering process of the present inventive concepts may be used in a soldering process for mounting 3D chips such as high bandwidth memory (HBM) devices.

As described above, in the method for soldering electronic devices according to some example embodiments, the pressurization mask 300 may be provided, the pressurization mask 300 including the transparent plate 310, the plurality of light absorbing patterns 320 provided on the first surface 310a of the transparent plate 310, and the light reflecting pattern 330 provided on the second surface 310b of the transparent plate 310. The pressurization mask 300 may be aligned such that the plurality of light absorbing patterns 320 correspond to (e.g., at least partially overlap in the vertical direction with) the plurality of semiconductor chips 20, respectively. The pressurization mask 300 may be moved in the vertical direction (Z direction) such that the plurality of light absorbing patterns 320 may be in contact with the plurality of semiconductor chips 20. The light L may be irradiated to the pressurization mask 300 by using the lamp heater 100. In addition, by using the pressurization mask 300, heat may be selectively transferred only to the plurality of semiconductor chips 20 among the package substrate 11.

In selectively transferring heat only to the plurality of semiconductor chips 20, the light L irradiated to the light reflecting pattern 330 may be blocked by the light reflecting pattern 330, and the light L irradiated to the transparent plate 310 may be transmitted through the transparent plate 310 (e.g., to the plurality of light absorbing patterns 320 to generate heat to further transmit to the plurality of semiconductor chips 20). In addition, in selectively transferring heat only to the plurality of semiconductor chips 20, the light L passing (transmitted) through the transparent plate 310 may be transmitted to (e.g., may reach) the plurality of light absorbing patterns 320 as reached light, and the light absorbing patterns 320 may absorb the reached light as absorbed light, and the plurality of light absorbing patterns 320 may convert the absorbed light into heat and transfer the heat to the plurality of semiconductor chips 20.

Accordingly, the method for soldering electronic devices may convert the heat transfer method from a radiative heat transfer method to a conductive heat transfer method by using the plurality of light absorbing patterns 320. Therefore, heat transfer efficiency to the semiconductor chip may be increased, thereby reducing excessive power consumption by the apparatus for soldering electronic devices 10 during soldering operations (e.g., perform soldering operations using an intense pulsed light (IPL) method with reduced power consumption by the lamp heater 100 to emit light L).

Additionally, the method for soldering electronic devices may block light from being irradiated to regions excluding the mounting regions by using the light reflecting pattern. Therefore, it is possible to reduce, minimize, or prevent warpage from occurring in the package substrate 11 due to radiant energy. Additionally, the method for soldering electronic devices may directly reduce, minimize, or prevent warpage from occurring in the package substrate 11 by applying pressure to the package substrate 11 by using a pressurization mask 300.

Hereinafter, the pressurization mask 301 according to some example embodiments will be described.

FIG. 19 is a cross-sectional view illustrating a pressurization mask 301 according to some example embodiments. FIG. 20 is a plan view illustrating a pressurization mask according to some example embodiments. FIG. 21 is an enlarged view illustrating portion 'N5' in FIG. 19 according to some example embodiments. FIG. 19 is a cross-sectional view taken along the line C-C' in FIG. 20 according to some example embodiments.

Since the pressurization mask 301 is the same or substantially the same as the pressurization mask 300 described in FIGS. 1 to 7 except for a plurality of light absorbing patterns 321 and a light reflecting pattern 331, repeated descriptions of the same components are omitted.

Referring to FIGS. 19 to 21, the pressurization mask 301 may include a transparent plate 310 configured to transmit light and extending in a first direction (X direction), and a plurality of light absorbing patterns 321 provided on the first surface 310a of the transparent plate 310 and configured to absorb a portion of the light (e.g., a portion of incident light on the pressurization mask 301 that is transmitted through the transparent plate 310), and a light reflecting pattern 331 provided on the second surface 310b of the transparent plate 310 and configured to reflect another portion of the light.

In some example embodiments, the plurality of light absorbing patterns 321 may be provided at regions overlapped (e.g., in the vertical direction) with the conductive connection members 24 among a portion of the first surface 310a of the transparent plate 310. For example, each of the plurality of light absorbing patterns 321 may include a central structure 323 and a plurality of outer structures 325 (e.g., outer structures 325a, 325b, 325c, and 325d).

For example, when viewed in a plan view, the first surface 310a of the transparent plate 310 has a plurality of overlap regions OR overlapped with the plurality of conductive connection members 24 in the vertical direction Z and an external region ER excluding the plurality of overlap regions OR. For example, the plurality of overlap regions OR may be respectively provided within the plurality of transmission regions HA.

The plurality of light absorbing patterns 321 may be provided on the plurality of overlap regions OR. For example, the central structure 323 may be provided on a region of the plurality of overlap regions OR to be overlapped a central conductive connection members provided at the center of the plurality of semiconductor chips 20. Additionally, the plurality of outer structures 325 may be provided on regions of the plurality of overlap regions OR to be overlapped (e.g., in the vertical direction) with a plurality of outer conductive connection members 24 provided on corners of each of the plurality of semiconductor chips 20.

In some example embodiments, the light reflecting pattern 331 may be provided on a region not overlapped (e.g., in the vertical direction) with the plurality of light absorbing patterns 321 among the second surface 310b of the transparent plate 310. For example, the light reflecting pattern 331 may be provided on the external region ER excluding the region overlapping with the plurality of conductive connection members 24.

Accordingly, the pressurization mask 301 according to some example embodiments may selectively transfer heat only to the region where the plurality of conductive connection members 24 are provided. Additionally, the pressurization mask 301 according to some example embodiments may block light from being irradiated to regions excluding the region where the plurality of conductive connection members 24 are provided.

Hereinafter, a method for soldering electronic devices by using the pressurization mask 301 according to some example embodiments will be described.

Figure 22:
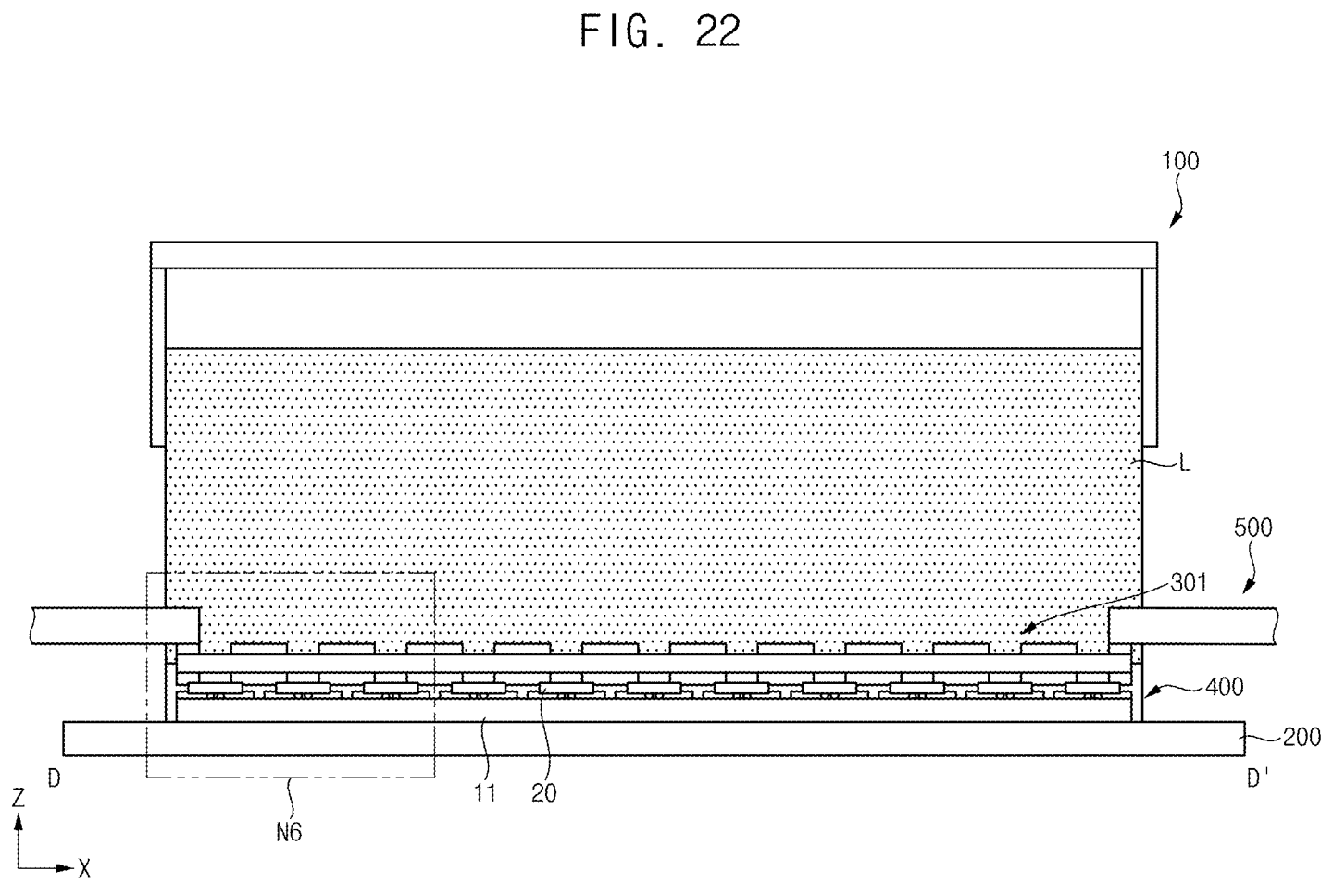
Figure 23:
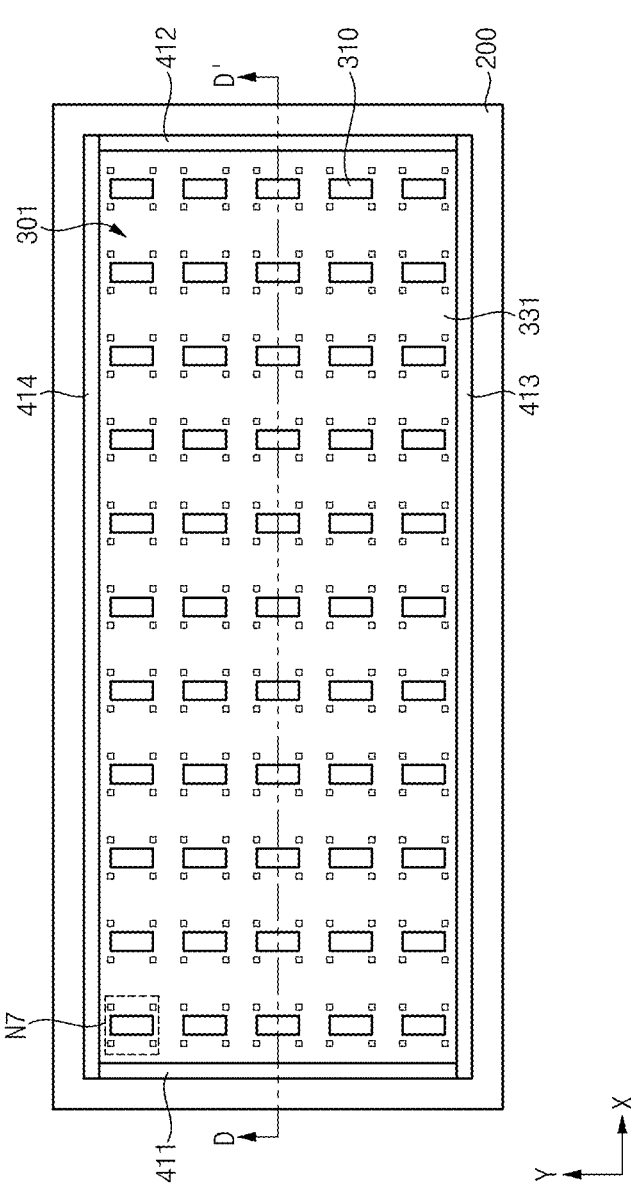
Figure 24:
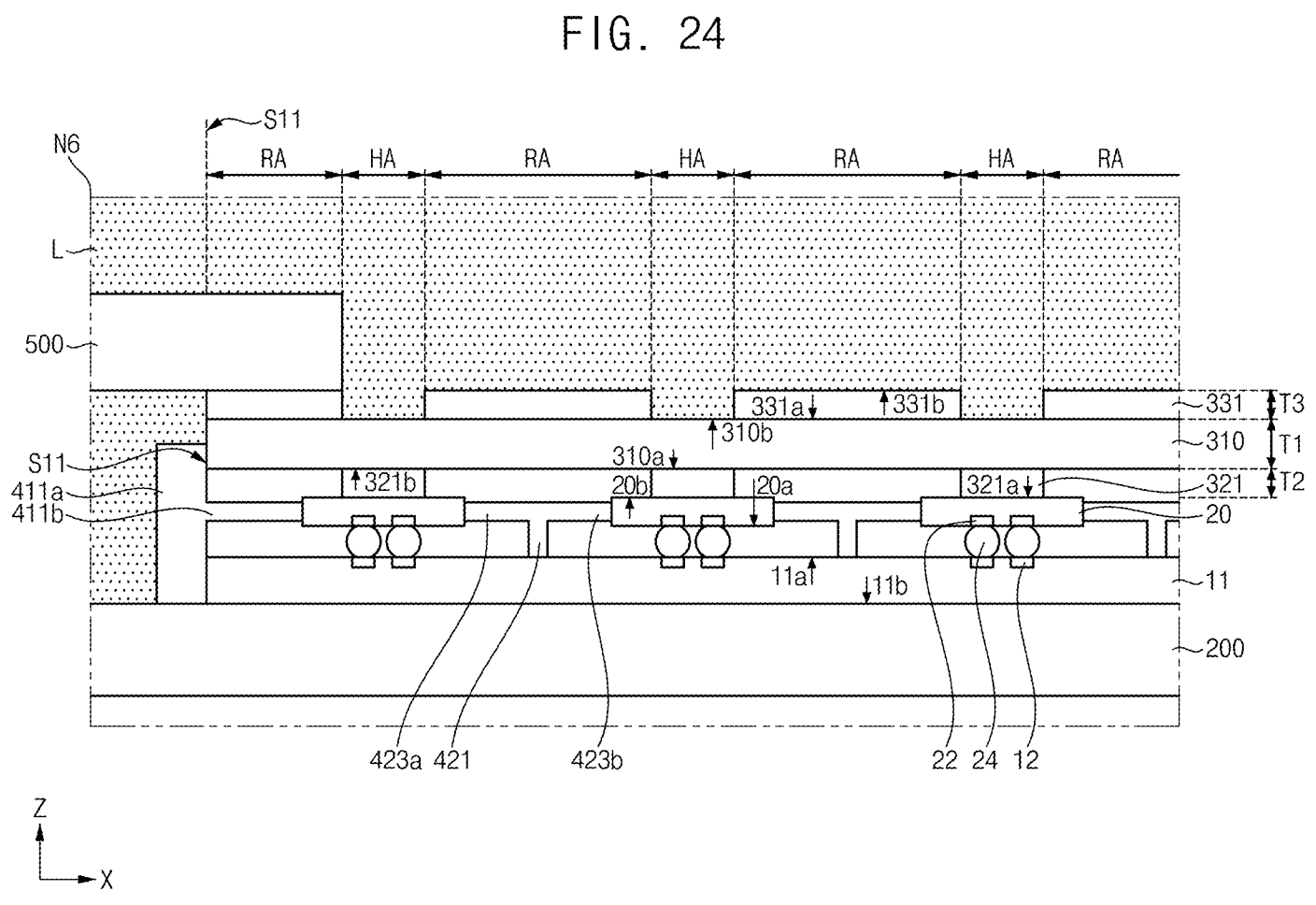
Figure 25:
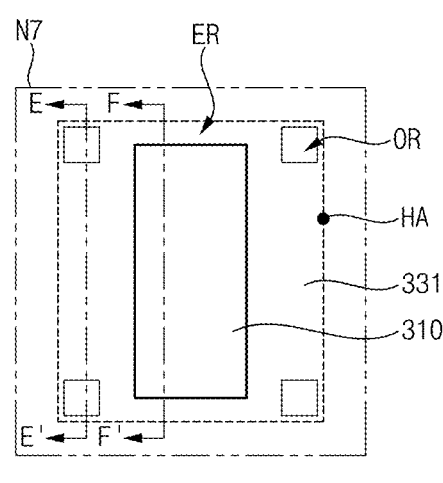
Figure 25:
Figure 26:
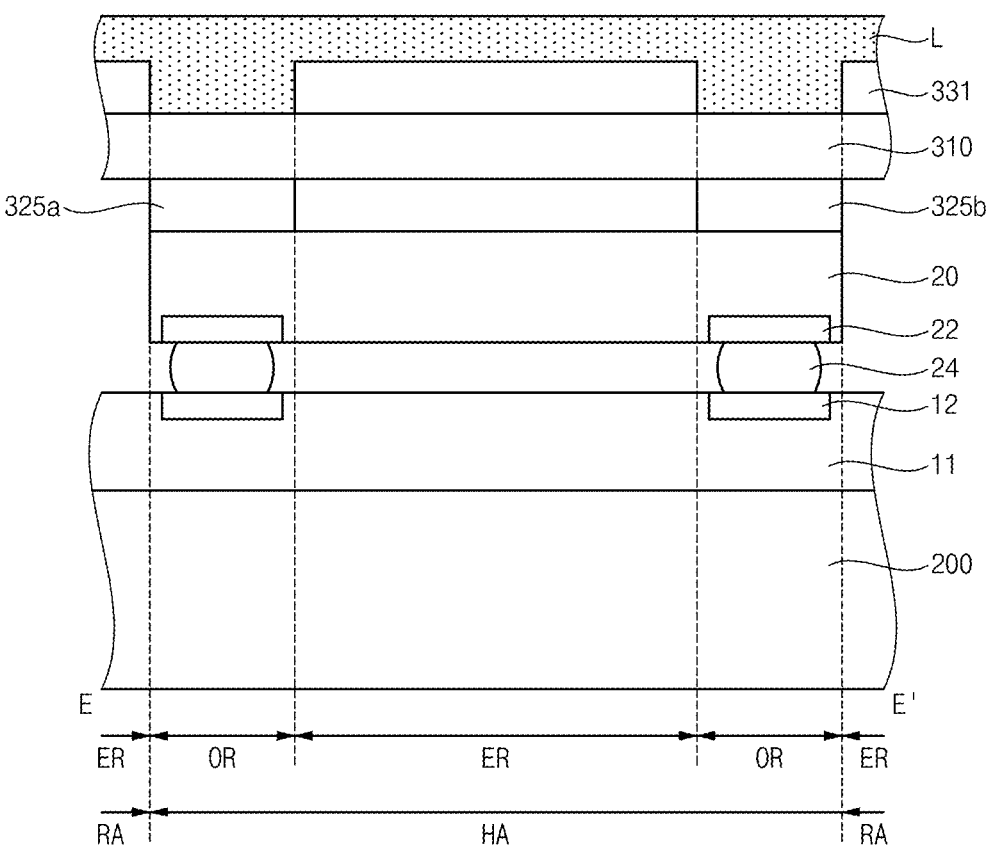
Figure 26:
Figure 27:
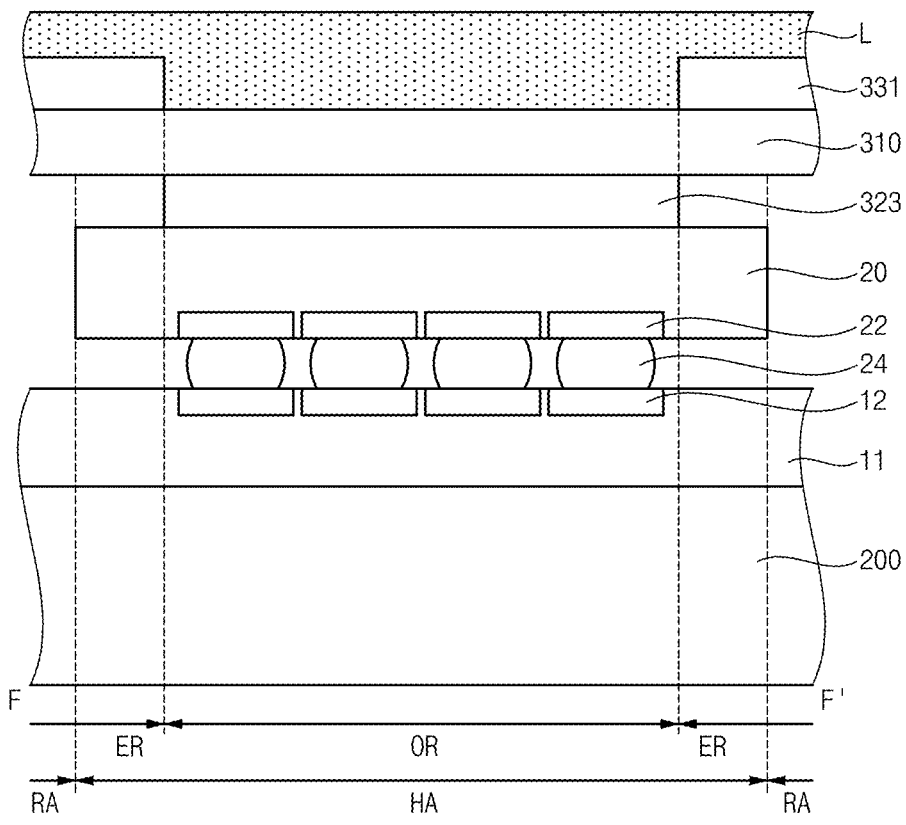
Figure 27:

FIG. 22 is a cross-sectional view illustrating that light is irradiated on a pressurization mask according to some example embodiments. FIG. 23 is a plan view illustrating that the pressurization mask introduced by a supporting member according to some example embodiments. FIG. 24 is an enlarged view of portion 'N6' in FIG. 22 according to some example embodiments. FIG. 25 is an enlarged view illustrating portion 'N7' in FIG. 23 according to some example embodiments. FIG. 26 is a cross-sectional view taken along the line E-E' in FIG. 25 according to some example embodiments. FIG. 27 is a cross-sectional view taken along the line F-F' in FIG. 25 according to some example embodiments.

In a method of soldering electronic devices according to some example embodiments, since the method of soldering electronic devices according to some example embodiments is the same or substantially the same as the method of soldering electronic devices described in FIGS. 8 to 18 except for a region where heat is transferred, repeated description of the same process steps will be omitted. Additionally, in a method of soldering electronic devices according to some example embodiments, since the pressurization mask 301 is the same or substantially the same as the pressurization mask 301 described in FIGS. 19 to 21, repeated descriptions of the same components will be omitted.

Referring to FIGS. 22 to 27, light L may be irradiated from the lamp heater 100 to the pressurization mask 300. Heat may be selectively transferred selectively (e.g., only) to regions where the plurality of conductive connection members 24 are provided (e.g., regions overlapping with the conductive connection members 24 in the vertical direction) through the pressurization mask 300, thereby completing the method for soldering electronic devices according to some example embodiments.

Portion of the light L irradiated from the lamp heater 100 to the pressurization mask 301 may be reflected by the light reflecting pattern 331 of the pressurization mask 300, so the light is blocked. As shown, the light reflecting pattern 331 may have a first surface 331a contacting the transparent plate 310 (e.g., at the second surface 310b thereof) and a second surface 331b facing the lamp heater 100, where the light reflecting pattern 331 may be configured to reflect and/or block incident light L that is incident on the second surface 331b. For example, the region excluding the plurality of regions overlapping the conductive connection members 24 (e.g., a region configured to be exposed from the conductive connection members 24 in the vertical direction) may be overlapped (e.g., in the vertical direction) with the light reflecting pattern 331 of the pressurization mask 300. Accordingly, the light reflecting pattern 331 may block the light (e.g., incident light) in the region excluding the plurality of regions overlapping with the conductive connection members 24 (e.g., block and/or reflect said incident light that is incident on the second surface 331b from being transmitted through the transparent plate 310).

A portion of the light irradiated from the lamp heater 100 to the pressurization mask 300 may pass through (e.g., may be transmitted through) the transparent plate 310 of the pressurization mask 300, the portion of the light may be transmitted to upper surfaces (second surfaces 320b) of the plurality of light absorbing patterns 320 as reached light. The reached light may be absorbed by the plurality of light absorbing patterns 321 as absorbed light.

The absorbed light may be converted into heat, and the heat may be transmitted to the plurality of semiconductor chips 20 from lower surfaces 320a of the plurality of light absorbing patterns 320 that are in contact with the plurality of semiconductor chips 20. For example, the converted heat may be transferred to regions overlapped (e.g., in the vertical direction) with the plurality of conductive connection members 24 among the upper surfaces of the plurality of semiconductor chips 20.

Accordingly, each of the plurality of light absorbing patterns 320 may transfer heat energy to the conductive connection members 24 of each of the plurality of semiconductor chips by converting the radiative heat transfer method into the conductive heat transfer method.

Therefore, the light irradiated to the region excluding (e.g., exposed from, in the vertical direction) the plurality of regions overlapped (in the vertical direction) with the conductive connection members 24 may be blocked by the light reflecting pattern 330 of the pressurization mask 300 and the light irradiated to the plurality of region overlapping (in the vertical direction) the conductive connection members 24 may be transmitted by the transparent plate 310 to the plurality of light absorbing patterns 320 of the pressurization mask 300. Additionally, the method of transferring heat energy to the plurality of semiconductor chips 20 may include the light that is transmitted to the plurality of light absorbing patterns 320 being converted by the plurality of light absorbing patterns 320 of the pressurization mask 300 into heat. Therefore, in the method of soldering electronic devices according to some example embodiments, the heat may be selectively transferred to the plurality of regions overlapped with the plurality of conductive connection members 24.

Hereinafter, the pressurization mask 302 according to some example embodiments will be described.

FIG. 28 is a cross-sectional view illustrating a pressurization mask according to some example embodiments. FIG. 29 is a plan view illustrating a pressurization mask according to some example embodiments. FIG. 28 is a cross-sectional view taken along the line G-G' in FIG. 29.

Since the pressurization mask 302 is the same or substantially the same as the pressurization mask 300 described in FIGS. 1 and 7 except for the light reflecting pattern 332, repeated descriptions of the same components are omitted.

Referring to FIGS. 28 and 29, a pressurization mask 302 may include a transparent plate 310 configured to transmit light and extending in a first direction (X direction), a plurality of light absorbing patterns 320 configured to absorb a portion of the light (e.g., a portion of the light transmitted through the transparent plate 310) and provided on the first surface 310a of the transparent plate 310, and a light reflecting pattern 332 configured to reflect a portion of the light (e.g., a separate portion of the light transmitted through the transparent plate 310) and provided on the second surface 310b of the transparent plate 310.

In some example embodiments, the light reflecting pattern 332 may be provided on a region excluding (e.g., offset in the in-plane direction of the transparent plate 310) a plurality of absorption regions HA on which the plurality of light absorbing patterns 320 are provided on the first surface 310a of the transparent plate 310.

For example, the light reflecting pattern 332 may cover the entire first surface 310a of the transparent plate 310 (e.g., the entire first surface 310a that is exposed from the light absorbing patterns 320 in the vertical direction) to expose (e.g., in the vertical direction) at least one surface of each of the plurality of light absorbing patterns 320. For example, the light reflecting pattern 332 may be provided on and/or may at least partially define a reflection region RA excluding the plurality of absorption regions HA. For example, the light reflecting pattern may reflect the light that is passed through the reflection region RA of the transparent plate 310.

For example, after forming a plurality of light absorbing patterns 320 on the first surface 310a of the transparent plate 310, a reflecting layer may be formed by dispensing a light reflecting material on the first surface 310a of the transparent plate 310. Thereafter, the reflecting layer may be partially removed until at least one surface of each of the plurality of light absorbing patterns 320 is exposed (e.g., in the vertical direction), thereby forming the light reflecting pattern 332.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of some example embodiments and is not to be construed as limiting thereof. Although some example embodiments have been described, those skilled in the art will readily appreciate that many modifications are possible in example some embodiments without materially departing from the novel teachings and advantages of the present inventive concepts. Accordingly, all such modifications are intended to be included within the scope of example embodiments as defined in the claims.

What is claimed is:

1. An apparatus for soldering electronic devices, the apparatus comprising:

a base plate configured to support a package substrate, wherein a plurality of semiconductor chips are on the package substrate in a plurality of rows and a plurality of columns;

a lamp heater configured to irradiate light and emit radiation heat toward the plurality of semiconductor chips in a vertical direction, to mount the plurality of semiconductor chips on the package substrate;

a pressurization mask including a transparent plate between the base plate and the lamp heater, wherein the transparent plate includes a first surface facing the base plate and a second surface opposite to the first surface, a plurality of light absorbing patterns on a plurality of transmission regions of the first surface of the transparent plate, such that the plurality of light absorbing patterns at least partially overlap with corresponding semiconductor chips of the plurality of semiconductor chips in the vertical direction, the second surface of the transparent plate being free of the plurality of light absorbing patterns, and a light reflecting pattern on a reflection region of the second surface of the transparent plate, wherein the reflection region is not overlapped with the plurality of transmission regions in the vertical direction; and a mask holder enabling the pressurization mask to move in the vertical direction and press the corresponding semiconductor chips by contacting the plurality of light absorbing patterns with the corresponding semiconductor chips.

2. The apparatus of claim 1, wherein the lamp heater includes a xenon (Xe) lamp configured to irradiate a pulsed light.

3. The apparatus of claim 1, further comprising:
a supporting member including a mask frame and a plurality of horizontal ribs,
wherein the mask frame is configured to support a plurality of outer portions of the transparent plate such that the pressurization mask is parallel with the base plate, and
the plurality of horizontal ribs each extend from the mask frame in at least one of a first direction or a second direction, the second direction perpendicular to the first direction.

4. The apparatus of claim 1, wherein the first surface of the transparent plate is free of a light reflecting pattern.

5. The apparatus of claim 1, wherein
the transparent plate has a first thickness in the vertical direction, each of the light absorbing patterns has a second thickness in the vertical direction, and the light reflecting pattern has a third thickness in the vertical direction, and
each of the second thickness and the third thickness is smaller than the first thickness.

6. The apparatus of claim 5, wherein the second thickness and the third thickness are each within a range of 10 μm to 100 μm, and the first thickness is within a range of 3 mm to 10 mm.

7. The apparatus of claim 1, wherein the transparent plate includes a transparent material configured to transmit the light irradiated from the lamp heater.

8. The apparatus of claim 7, wherein the plurality of light absorbing patterns include an absorbing material, the absorbing material configured to absorb incident light that is irradiated from the lamp heater and has passed through the transparent plate, the absorbing material configured to exhibit a photothermal effect, and
wherein the light reflecting pattern includes a reflective material, the reflective material configured to reflect incident light that is irradiated from the lamp heater.

9. An apparatus for soldering electronic devices, the apparatus comprising:
a base plate configured to support a package substrate, wherein a plurality of semiconductor chips are on the package substrate in a plurality of rows and a plurality of columns;
a lamp heater configured to irradiate light to the plurality of semiconductor chips in a vertical direction, to mount the plurality of semiconductor chips on the package substrate;
a pressurization mask including a transparent plate between the base plate and the lamp heater, wherein the transparent plate includes
a first surface facing the base plate and a second surface opposite to the first surface, and
a plurality of light absorbing patterns on a plurality of transmission regions of the first surface of the transparent plate, wherein the plurality of transmission regions at least partially overlap with corresponding semiconductor chips of the plurality of semiconductor chips in the vertical direction, the second surface of the transparent plate being free of the plurality of light absorbing patterns; and a mask holder secured to outer portions of the transparent plate, the mask holder configured to move the pressurization mask in the vertical direction to apply pressure to the plurality of semiconductor chips by contacting the plurality of light absorbing patterns with the plurality of semiconductor chips.

10. The apparatus of claim 9, wherein
the transparent plate includes a reflection region that is not overlapped with the plurality of transmission regions in the vertical direction, the reflection region on at least one of the first surface or the second surface, and
the pressurization mask includes a light reflecting pattern on the reflection region.

11. The apparatus of claim 10, wherein the light reflecting pattern includes a reflective material, the reflective material configured to reflect incident light that is irradiated from the lamp heater.

12. The apparatus of claim 9, further comprising:
a supporting member including a mask frame and a plurality of horizontal ribs,
wherein the mask frame is configured to support a plurality of outside portions of the transparent plate such that the pressurization mask is parallel with the base plate, and
wherein the plurality of horizontal ribs each extend from the mask frame in at least one of a first direction or a second direction, the second direction perpendicular to the first direction.

13. The apparatus of claim 9, wherein
the transparent plate has a first thickness, and each of the light absorbing patterns has a second thickness, and
the second thickness is smaller than the first thickness.

14. The apparatus of claim 13, wherein the second thickness is within a range of 10 μm to 100 μm, and the first thickness is within a range of 3 mm to 10 mm.

15. The apparatus of claim 9, wherein the transparent plate includes a transparent material, the transparent material configured to transmit the light irradiated from the lamp heater, and
wherein the plurality of light absorbing patterns include an absorbing material, the absorbing material configured to absorb the light that has passed through the transparent plate, the absorbing material configured to exhibit a photothermal effect.

16. An apparatus for soldering electronic devices, the apparatus comprising:
a base plate configured to support a package substrate, wherein a plurality of semiconductor chips are on the package substrate and a plurality of conductive connection members are on a lower surface of each semiconductor chip of the plurality of semiconductor chips;
a lamp heater configured to irradiate light to the plurality of semiconductor chips in a vertical direction, to mount the plurality of semiconductor chips on the package substrate via separate, respective conductive connection members of the plurality of conductive connection members;
a pressurization mask including a transparent plate between the base plate and the lamp heater, wherein the transparent plate includes
a first surface facing the base plate and a second surface opposite to the first surface, and
a light reflecting pattern on a reflection region of the second surface of the transparent plate, wherein the reflection region is not overlapped with the plurality of conductive connection members in the vertical direction; and a mask holder secured to outer portions of the transparent plate, the mask holder configured to move the pressurization mask in the vertical direction and press the corresponding semiconductor chips by contacting the pressurization mask with the corresponding semiconductor chips, wherein the transparent plate includes a plurality of transmission regions overlapped with the plurality of conductive connection members in the vertical direction, the plurality of transmission regions being on the first surface, and wherein the pressurization mask includes a plurality of light absorbing patterns on the plurality of transmission regions on the first surface, the second surface of the transparent plate being free of the plurality of light absorbing patterns.

17. The apparatus of claim 16, wherein the transparent plate has a first thickness, the light reflecting pattern has a second thickness, and the second thickness is smaller than the first thickness.

18. The apparatus of claim 16, wherein the transparent plate includes a transparent material, the transparent material configured to transmit the light irradiated from the lamp heater, and the light reflecting pattern includes a reflective material, the reflective material configured to reflect incident light that is irradiated from the lamp heater.

19. The apparatus of claim 16, further comprising:

a supporting member including a mask frame and a plurality of horizontal ribs, wherein the mask frame is configured to support a plurality of outside portions of the transparent plate such that the pressurization mask is parallel with the base plate, and wherein the plurality of horizontal ribs each extend from the mask frame in at least one of a first direction or a second direction, the second direction perpendicular to the first direction.

* * * * *